(12) United States Patent
Nakasugi et al.

(10) Patent No.: US 7,985,958 B2
(45) Date of Patent: Jul. 26, 2011

(54) ELECTRON BEAM DRAWING APPARATUS, DEFLECTION AMPLIFIER, DEFLECTION CONTROL DEVICE, ELECTRON BEAM DRAWING METHOD, METHOD OF MANUFACTURING SEMICONDUCTOR DEVICE, AND ELECTRON BEAM DRAWING PROGRAM

(75) Inventors: Tetsuro Nakasugi, Yokohama (JP);
Kazuo Tawarayama, Yokosuka (JP);
Hiroyuki Mizuno, Yokohama (JP);
Takumi Ota, Kawasaki (JP); Noriaki Sasaki, Yokohama (JP); Tatsuhiko Higashiki, Fujisawa (JP); Takeshi Koshiba, Yokohama (JP); Shunko Magoshi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 891 days.

(21) Appl. No.: 11/268,603

(22) Filed: Nov. 8, 2005

(65) Prior Publication Data
US 2006/0151721 A1     Jul. 13, 2006

(30) Foreign Application Priority Data
Nov. 9, 2004   (JP) ................................ 2004-325503

(51) Int. Cl.
*H01J 37/153* (2006.01)
(52) U.S. Cl. ............. 250/492.23; 250/492.1; 250/492.2; 250/492.22
(58) Field of Classification Search ............ 250/492.22, 250/492.23, 492.1, 492.2
See application file for complete search history.

(56) References Cited

U.S. PATENT DOCUMENTS

| 5,614,725 A * | 3/1997 | Oae et al. ............. 250/492.22 |
| 6,811,953 B2 | 11/2004 | Hatada et al. |
| 7,435,978 B2 * | 10/2008 | Nakasugi et al. ........ 250/492.22 |
| 2004/0065848 A1 | 4/2004 | Onishi et al. |

FOREIGN PATENT DOCUMENTS

| JP | 60-254615 | 12/1985 |
| JP | 3-270214 | 12/1991 |
| JP | 05-175106 | 7/1993 |
| JP | 06-013299 | 1/1994 |
| JP | 06-036997 | 2/1994 |
| JP | 9-251941 | 9/1997 |
| JP | 10-261565 | 9/1998 |
| JP | 10-289847 | 10/1998 |
| JP | 2000-77017 | 3/2000 |

(Continued)

OTHER PUBLICATIONS

Notice of Reasons for Rejection dated Feb. 22, 2010, from the Japanese Patent Office in corresponding Japanese application No. 2004-325503.

*Primary Examiner* — David A Vanore
(74) *Attorney, Agent, or Firm* — Finnegan, Henderson, Farabow, Garrett & Dunner, L.L.P.

(57) ABSTRACT

According to an aspect of the invention, there is provided an electron beam drawing apparatus comprising at least one stage of a deflection amplifier and a deflection unit, a first storage section which stores shot information at a drawing time, a second storage section which stores a correction table indicating a relation between the shot information and an output voltage of the deflection amplifier, and an adjusting section which adjusts an output of the deflection amplifier based on the correction table stored in the second storage section and the shot information stored in the first storage section.

5 Claims, 18 Drawing Sheets

FOREIGN PATENT DOCUMENTS

| | | |
|---|---|---|
| JP | 2000-124113 | 4/2000 |
| JP | 2001-267238 | 9/2001 |
| JP | 2002-246295 | 8/2002 |
| JP | 2003-151885 | 5/2003 |
| JP | 2003-188075 | 7/2003 |
| JP | 2003-188076 | 7/2003 |
| JP | 2003-530711 | 10/2003 |
| JP | 2004-22882 | 1/2004 |
| JP | 2004-140236 | 5/2004 |

* cited by examiner

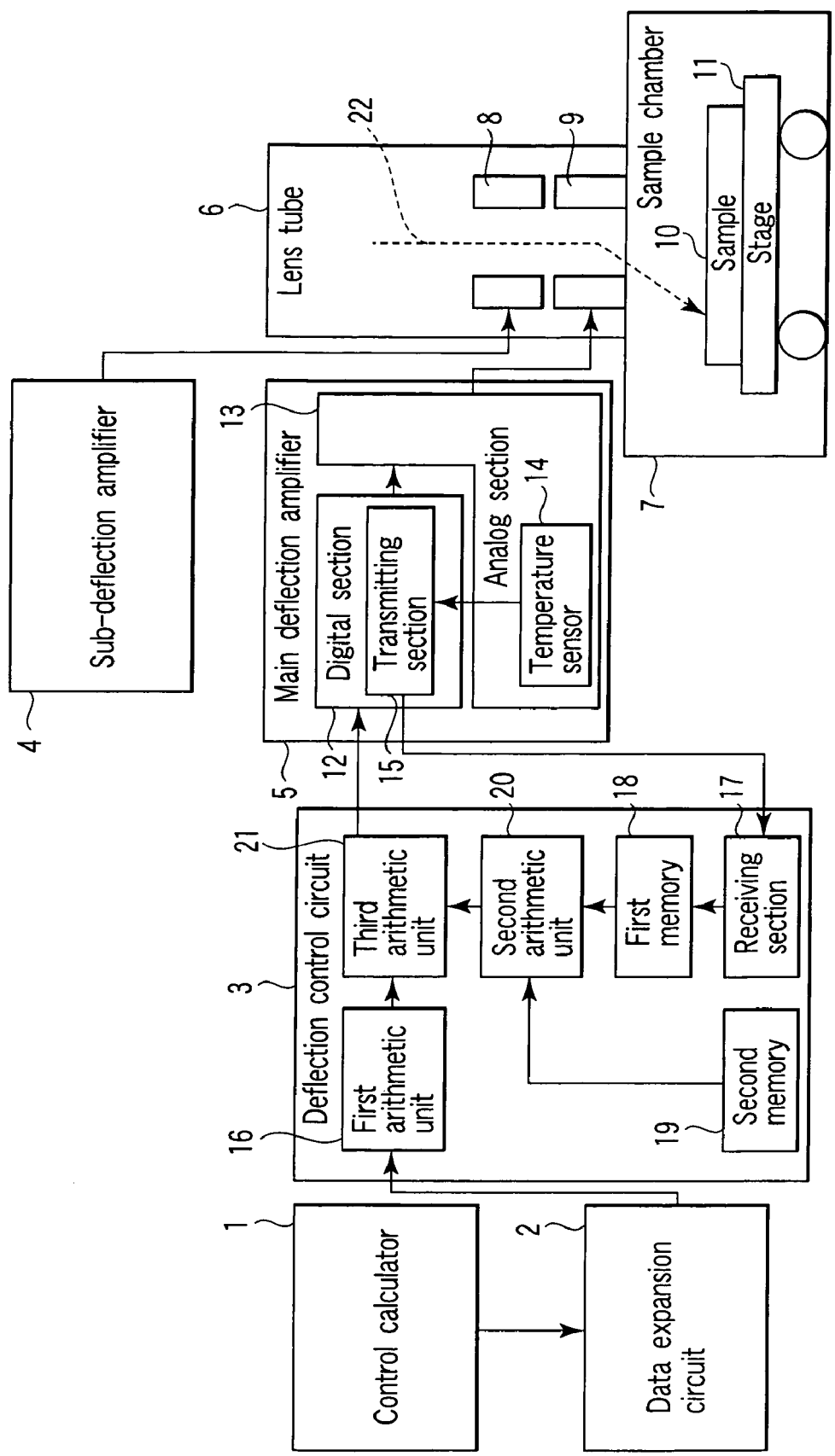
F I G. 1

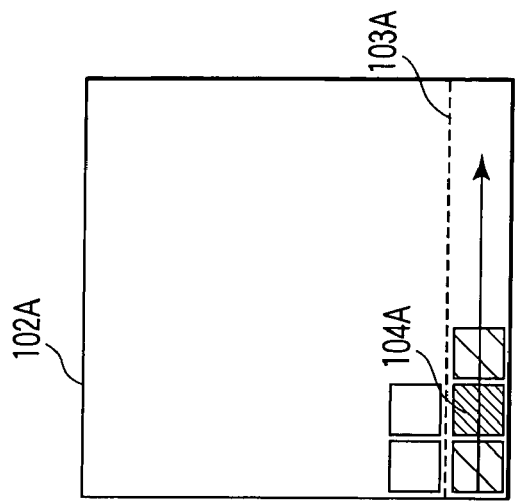
F I G. 5 B
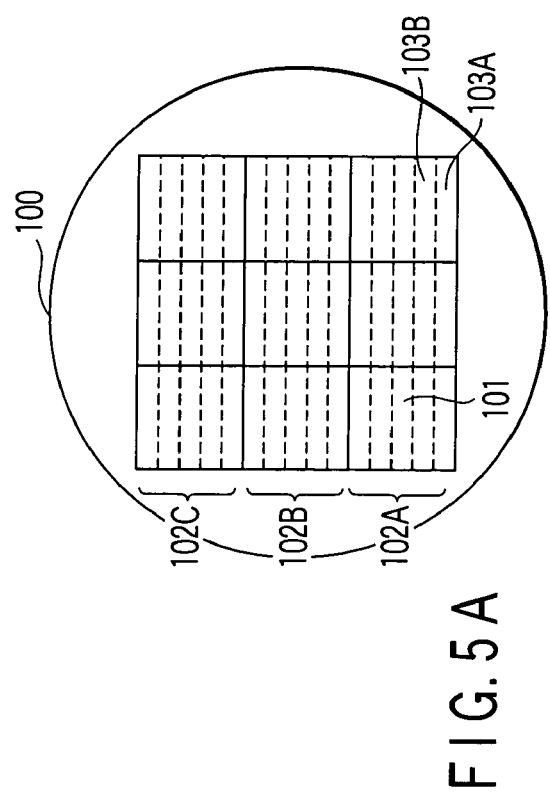
F I G. 5 A
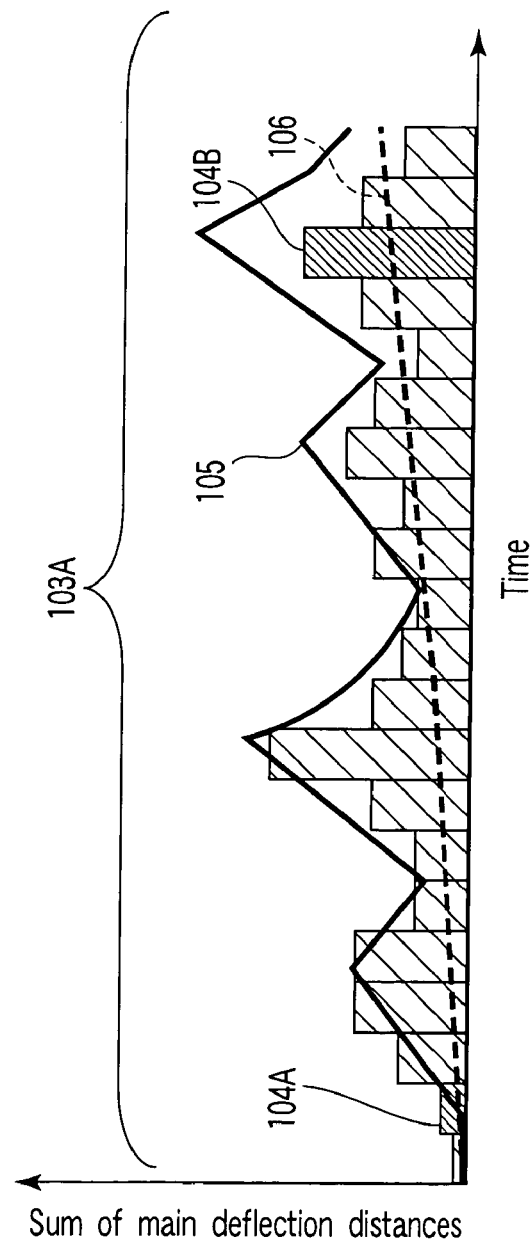
F I G. 5 C

Main deflection area

Sub-deflection area

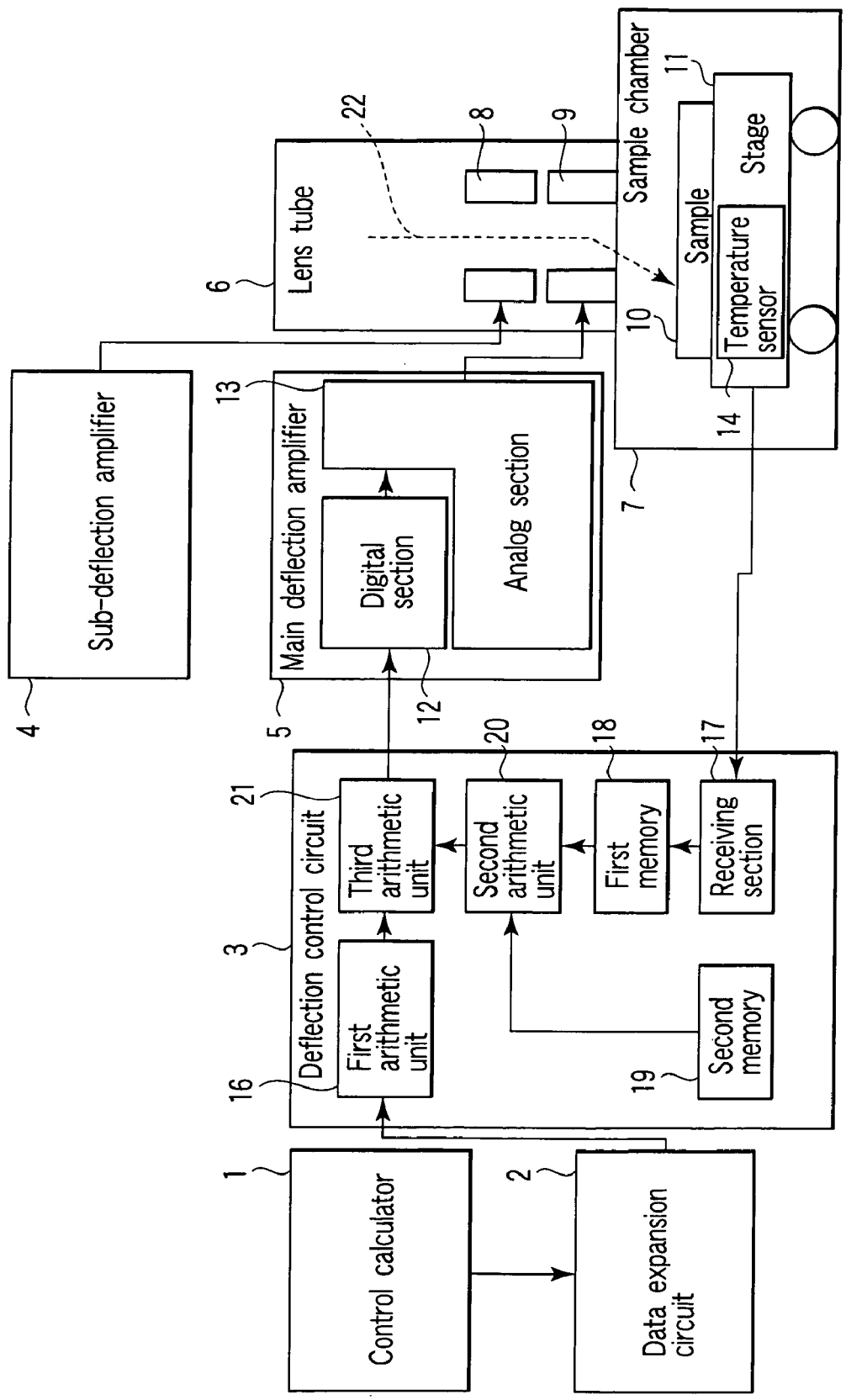
F I G. 9

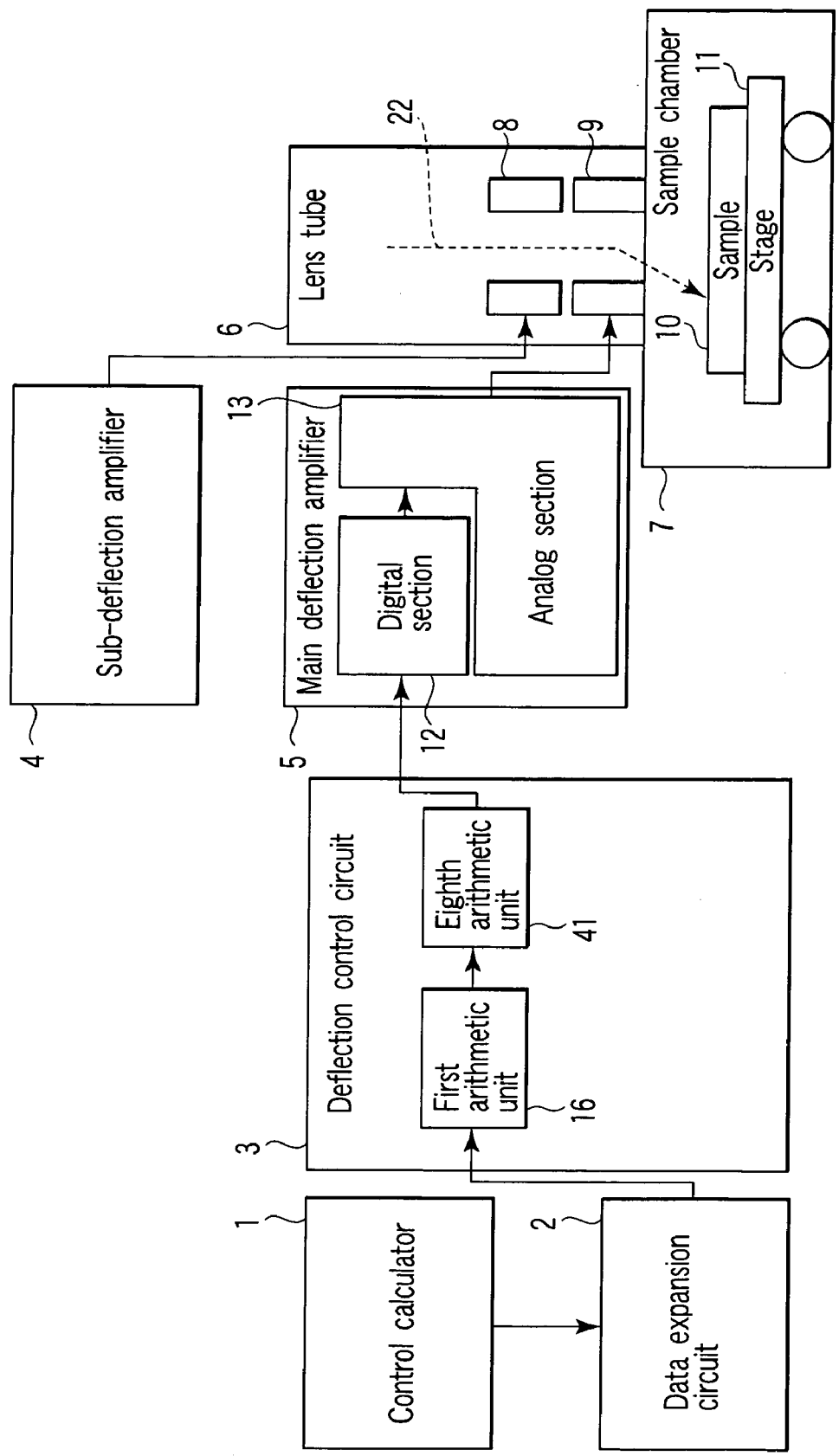
F I G. 13

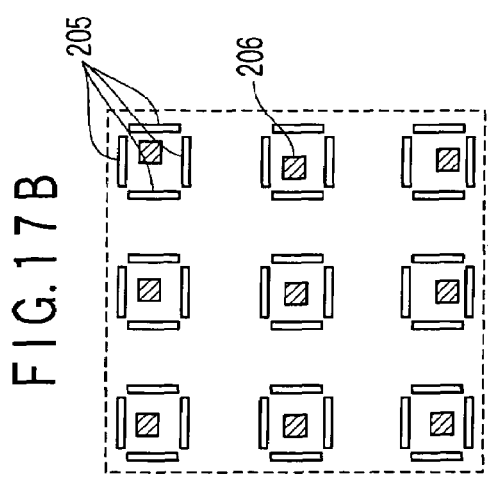
FIG. 17B
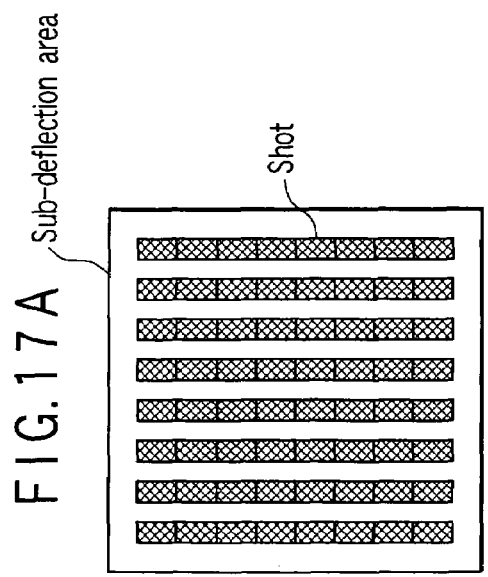
FIG. 17D
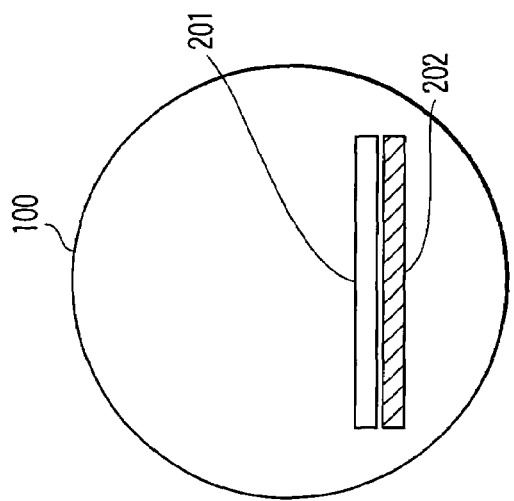
FIG. 17A
FIG. 17C

ELECTRON BEAM DRAWING APPARATUS, DEFLECTION AMPLIFIER, DEFLECTION CONTROL DEVICE, ELECTRON BEAM DRAWING METHOD, METHOD OF MANUFACTURING SEMICONDUCTOR DEVICE, AND ELECTRON BEAM DRAWING PROGRAM

CROSS-REFERENCE TO RELATED APPLICATIONS

This application is based upon and claims the benefit of priority from prior Japanese Patent Application No. 2004-325503, filed Nov. 9, 2004, the entire contents of which are incorporated herein by reference.

BACKGROUND OF THE INVENTION

1. Field of the Invention

The present invention relates to an electron beam drawing apparatus which draws a circuit pattern of a semiconductor integrated circuit on a wafer, a deflection amplifier, a deflection control device, an electron beam drawing method, a method of manufacturing a semiconductor device, and an electron beam drawing program.

2. Description of the Background Art

In a semiconductor manufacturing field, since an electron beam drawing apparatus has a pattern producing function, the device is applied to photomask preparation or direct drawing for small amounts of large varieties, and more particularly to trial manufacturing of a state-of-the-art device. In the electron beam drawing apparatus, an electron source image by a point beam system or a beam forming opening image by a variable forming system is projected or scanned on a sample surface to form a fine pattern. Especially in the latter variable forming system, a beam shape is controlled by a rectangular forming opening and a forming deflection unit, and a reduced image is projected on the sample surface to form the pattern efficiently. Therefore, in the variable forming system, speeding-up of the drawing is realized as compared with the point beam system in which the electron source image is transferred.

However, the conventional electron beam drawing apparatus has a problem that a drawing position deviates from a designed position depending on a property of a deflection amplifier. This is because an element temperature in the deflection amplifier, and especially a standard resistance for determining an output voltage change with an operation situation of the deflection amplifier. Accordingly, the drawing position deviation occurs depending on a density difference of the device pattern, and deterioration of a drawing precision is caused.

Moreover, a temperature change occurs in a stage depending on the operation situation. That is, in a case where the stage continuously runs, the temperature of the stage itself changes with a friction heat or a heat conducted from a motor which drives the stage. As a result, the stage expands or contracts. A stage position of the electron beam drawing apparatus is generally measured by a laser interferometer. However, for example, when the stage expands, and accordingly a position of a mirror attached to the stage changes, the stage position cannot be exactly measured. The temperature change of the stage causes a temperature change of a wafer. Especially, since an Si wafer has a thermal expansion ratio larger than that of any other general material for use in the stage, the wafer comparatively easily expands or contracts. As a result, there occurs a problem that a desired drawing position cannot be irradiated with any beam. Since the stage of the electron beam drawing apparatus is in vacuum, the heat conducted to the stage does not easily escape, and this influence is serious as compared with another exposure device whose stage is in atmospheric air.

It is to be noted that this type of electron beam drawing apparatus is disclosed in Jpn. Pat. Appln. KOKAI Publication Nos. 6-13299, 6-36997, and 2003-188075.

Moreover, this type of exposure technology is disclosed in Jpn. Pat. Appln. KOKAI Publication Nos. 2000-124113, 2001-267238, 2002-246295, and 2003-151885.

BRIEF SUMMARY OF THE INVENTION

According to an aspect of the invention, there is provided an electron beam drawing apparatus comprising: at least one stage of a deflection amplifier and a deflection unit; a first storage section which stores shot information at a drawing time; a second storage section which stores a correction table indicating a relation between the shot information and an output voltage of the deflection amplifier; and an adjusting section which adjusts an output of the deflection amplifier based on the correction table stored in the second storage section and the shot information stored in the first storage section.

According to another aspect of the invention, there is provided a deflection amplifier comprising: a first storage section which stores shot information at a drawing time; a second storage section which stores a correction table indicating a relation between the shot information and an output voltage; and an adjusting section which adjusts an output based on the correction table stored in the second storage section and the shot information stored in the first storage section.

According to another aspect of the invention, there is provided an electron beam drawing apparatus comprising: at least one stage of a deflection amplifier and a deflection unit; a temperature sensor disposed in the deflection amplifier; a first storage section which stores temperature information of the temperature sensor; a second storage section which stores a correction table indicating a relation between a temperature of the deflection amplifier and an output voltage of the deflection amplifier; and an adjusting section which adjusts an output of the deflection amplifier based on a correction table stored in the second storage section and the temperature information stored in the first storage section.

According to another aspect of the invention, there is provided a deflection amplifier comprising: a temperature sensor disposed in a main internal component; a first storage section which stores temperature information of the temperature sensor; a second storage section which stores a correction table indicating a relation between an internal temperature and an output voltage; and an adjusting section which adjusts an output based on the correction table stored in the second storage section and the temperature information stored in the first storage section.

According to another aspect of the invention, there is provided an electron beam drawing apparatus comprising: at least one stage of a deflection amplifier and a deflection unit; a stage on which a sample is placed; a temperature sensor disposed on the stage; a first storage section which stores temperature information of the temperature sensor; a second storage section which stores a correction table indicating a relation between a temperature of the stage and an output voltage of the deflection amplifier; and an adjusting section which adjusts an output of the deflection amplifier based on the correction table stored in the second storage section and the temperature information stored in the first storage section.

According to another aspect of the invention, there is provided an electron beam drawing apparatus comprising: at least one stage of a deflection amplifier and a deflection unit; a stage on which a sample is placed; a temperature sensor disposed on the stage; a first storage section which stores temperature information of the temperature sensor; a second storage section which stores a correction table indicating a relation between a temperature of the stage and a position of the stage; and an adjusting section which adjusts the position of the stage based on the correction table stored in the second storage section and the temperature information stored in the first storage section.

According to another aspect of the invention, there is provided an electron beam drawing apparatus comprising: at least one stage of a deflection amplifier and a deflection unit; a first arithmetic unit which calculates a main deflecting position based on main deflection distances in a main deflection area and which calculates a sum of the main deflection distances; a first storage section which stores the sum of the main deflection distances calculated by the first arithmetic unit; a second storage section which stores a correction table showing a relation between the sum of the main deflection distances and an output voltage of the deflection amplifier; a second arithmetic unit which calculates a correction coefficient of the main deflecting position from the sum of the main deflection distances stored in the first storage section and the correction table stored in the second storage section; and a third arithmetic unit which corrects the main deflecting position calculated by the first arithmetic unit by means of the correction coefficient calculated by the second arithmetic unit, wherein the deflection amplifier controls the deflection unit based on the main deflecting position corrected by the third arithmetic unit.

According to another aspect of the invention, there is provided a deflection control device comprising: a first arithmetic unit which calculates a main deflecting position based on main deflection distances in a main deflection area and which calculates a sum of the main deflection distances; a first storage section which stores the sum of the main deflection distances calculated by the first arithmetic unit; a second storage section which stores a correction table showing a relation between the sum of the main deflection distances and an output voltage of a predetermined deflection amplifier; a second arithmetic unit which calculates a correction coefficient of the main deflecting position from the sum of the main deflection distances stored in the first storage section and the correction table stored in the second storage section; and a third arithmetic unit which corrects the main deflecting position calculated by the first arithmetic unit by means of the correction coefficient calculated by the second arithmetic unit.

According to another aspect of the invention, there is provided an electron beam drawing method comprising: dividing drawing data into small areas; acquiring shot information in the respective small areas; preparing a correction table indicating a relation between the shot information and an output voltage of a deflection amplifier; correcting an output of the deflection amplifier based on the shot information and the table; and irradiating a sample surface with a beam based on the corrected output of the amplifier.

According to another aspect of the invention, there is provided an electron beam drawing method comprising: dividing drawing data into small areas; acquiring shot information in the respective small areas; preparing a correction table indicating a relation between the shot information and position correction of the drawing data; correcting the drawing data based on the shot information and the correction table; and irradiating a sample surface with a beam based on the corrected drawing data.

According to another aspect of the invention, there is provided a method of manufacturing a semiconductor device, comprising: calculating a main deflecting position based on main deflection distances in a main deflection area, and calculating a sum of the main deflection distances to store the sum; storing a correction table showing a relation between the sum of the main deflection distances and an output voltage of a predetermined deflection amplifier; calculating a correction coefficient of the main deflecting position from the stored sum of the main deflection distances and the stored correction table; correcting the calculated main deflecting position by means of the correction coefficient; and controlling a predetermined deflection unit based on the corrected main deflecting position, and irradiating a semiconductor substrate surface with a beam to manufacture the semiconductor device.

According to another aspect of the invention, there is provided a method of manufacturing a semiconductor device, comprising: dividing drawing data into small areas; acquiring shot information in the respective small areas; preparing a correction table indicating a relation between the shot information and an output voltage of a deflection amplifier; correcting an output of the deflection amplifier based on the shot information and the table; and irradiating a semiconductor substrate surface with a beam based on the corrected output of the amplifier to thereby manufacture the semiconductor device.

According to another aspect of the invention, there is provided a n electron beam drawing program which allows a computer to execute: dividing drawing data into small areas; calculating a pattern density in each of the small areas to prepare a map in which there is described a relation between each small area and the pattern density; preparing a table constituted of a correction amount of a drawing position with respect to the pattern density; obtaining drawing data in which the drawing position of a pattern has been corrected based on the map and the table; and drawing the pattern on a sample surface based on the corrected drawing data.

BRIEF DESCRIPTION OF THE SEVERAL VIEWS OF THE DRAWING

FIG. 1 is a diagram showing a configuration of an electron beam drawing apparatus according to a first embodiment;

FIGS. 5A, 5B, and 5C are drawings showing a sum of main deflection distances according to the third embodiment;

FIG. 9 is a diagram showing a configuration of an electron beam drawing apparatus according to a fifth embodiment;

FIG. 13 is a diagram showing a configuration of an electron beam drawing apparatus according to the sixth embodiment;

FIGS. 17A, 17B, 17C, and 17D are diagrams showing the preparation of the correction table according to the seventh embodiment.

DETAILED DESCRIPTION OF THE INVENTION

Figure 2:
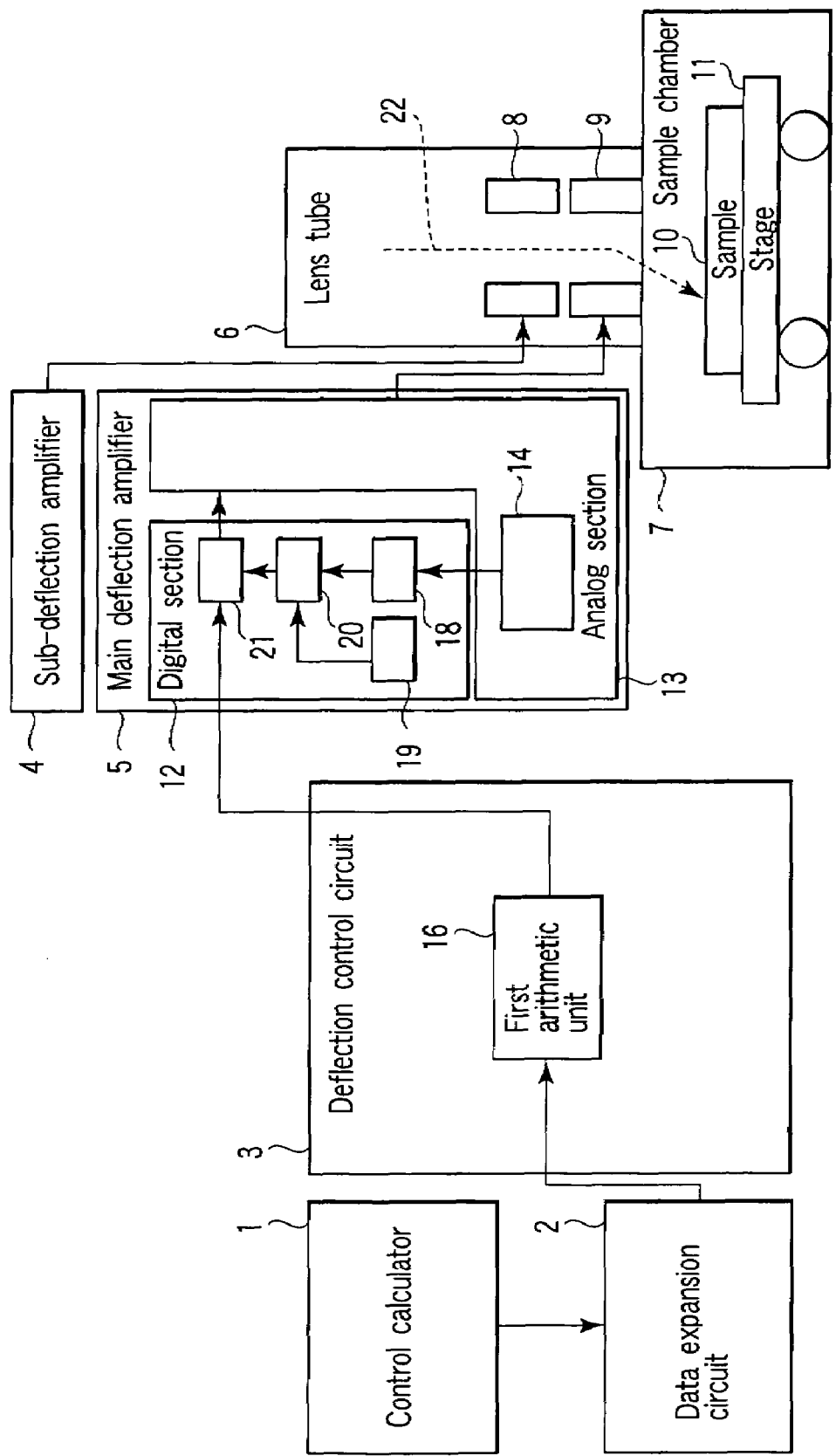
FIG. 2 is a diagram showing a configuration of an electron beam drawing apparatus according to a second embodiment.

Embodiments of the present invention will be described hereinafter with reference to the drawings.

FIG. 1 is a diagram showing a configuration of an electron beam drawing apparatus (charged beam exposure apparatus) for use in steps of manufacturing a semiconductor device according to a first embodiment of the present invention. A main part of the apparatus shown in FIG. 1 comprises: a control calculator 1; a data expansion circuit 2; a deflection control circuit 3; a sub-deflection amplifier 4; a main deflection amplifier 5; a lens tube 6; a sample chamber 7; a lens control section (not shown); a stage control section (not shown); an electron gun control section (not shown) and the like. The deflection control circuit 3 comprises: a first arithmetic unit 16; a receiving section 17; a first memory (first storage section) 18; a second memory (second storage section) 19; a second arithmetic unit 20; and a third arithmetic unit 21. The main deflection amplifier 5 is provided with a digital section 12 and an analog section 13. A sub-deflection unit 8 and a main deflection unit 9 are disposed in the lens tube 6. A stage 11 for placing a sample (semiconductor substrate, wafer) 10 thereon is disposed in the sample chamber 7.

A function of the above-described electron beam drawing apparatus will be described hereinafter. The digital section 12 of the main deflection amplifier 5 processes drawing data from the deflection control circuit 3. The analog section 13 of the main deflection amplifier 5 converts the data processed by the digital section 12 into an output voltage to the main deflection unit 9. The analog section 13 is provided with a temperature sensor 14 for measuring a temperature in the vicinity of a main component in the analog section 13, and the digital section 12 is provided with a transmitting section 15 for processing data of the temperature sensor 14 to transmit the data to the deflection control circuit 3.

The first arithmetic unit 16 of the deflection control circuit 3 processes the drawing data from the data expansion circuit 2. This first arithmetic unit 16 performs arithmetic processing to correct a strain of a beam deflecting position by a lens (not shown) which is disposed in the lens tube 6 and which is to be used in focusing the beam, processing to calculate an output of the main deflection amplifier 5 based on stage position information from the stage control section (not shown) and the like.

Moreover, the receiving section 17 of the deflection control circuit 3 receives temperature data of the temperature sensor 14 disposed in the main deflection amplifier 5 from the transmitting section 15. The temperature data transmitted from the transmitting section 15 is received by the receiving section 17, A/D converted, and thereafter stored in the first memory 18 in the deflection control circuit 3. In the second memory 19 in the deflection control circuit 3, a temperature correction table is stored in which there is described a relation between the temperature in the main deflection amplifier and the output voltage of the main deflection amplifier.

The second arithmetic unit 20 calculates a temperature adjusting coefficient for adjusting the output voltage of the main deflection amplifier 5 based on the temperature data of the main deflection amplifier stored in the first memory 18 and the temperature correction table stored in the second memory 19. The third arithmetic unit 21 adds the temperature adjusting coefficient sent from the second arithmetic unit 20 to the drawing data sent from the first arithmetic unit 16 or multiplies the drawing data by the coefficient to correct the drawing data. The third arithmetic unit 21 sends the corrected drawing data to the digital section 12 of the main deflection amplifier 5.

The digital section 12 of the main deflection amplifier 5 controls the main deflection unit 9 of the lens tube 6 via the analog section 13 based on the drawing data sent from the deflection control circuit 3, and deflects an electron beam 22 to draw a desired pattern on the sample 10 on the stage 11.

According to the first embodiment, the temperature of the main deflection amplifier 5 is measured, and the output of the main deflection amplifier 5 is corrected based on the temperature change. As a result, even in a state in which the temperature of the main deflection amplifier fluctuates depending on a density of the pattern of the sample 10 during the drawing, and any desired output voltage is not obtained depending on a temperature characteristic of the element in the main deflection amplifier, the output can be corrected to perform high-precision drawing.

FIG. 2 is a diagram showing a configuration of an electron beam drawing apparatus according to a second embodiment of the present invention. In FIG. 2, the same part as that of FIG. 1 is denoted with the same reference numerals. A basic configuration of the apparatus shown in FIG. 2 is similar to that of FIG. 1, but the second embodiment is different in that the first memory 18, the second memory 19, the second arithmetic unit 20, and the third arithmetic unit 21 mounted in the deflection control circuit 3 in FIG. 1 are mounted in a main deflection amplifier 5.

A function of the above-described electron beam drawing apparatus will be described hereinafter. An output of the temperature sensor 14 disposed in the analog section 13 of the main deflection amplifier 5 is stored in the first memory 18 disposed in the digital section 12 of the main deflection amplifier 5. In the second memory 19 of the digital section 12, a temperature correction table is stored in which there is described a relation between a main deflection amplifier temperature and an output voltage of the main deflection amplifier.

The second arithmetic unit 20 calculates a temperature adjusting coefficient for adjusting the output voltage of the main deflection amplifier 5 based on temperature data of the main deflection amplifier stored in the first memory 18 and the temperature correction table stored in the second memory 19. The third arithmetic unit 21 adds the temperature adjusting coefficient sent from the second arithmetic unit 20 to the drawing data sent from the first arithmetic unit 16 or multiplies the drawing data by the coefficient.

The digital section 12 of the main deflection amplifier 5 controls the main deflection unit 9 of the lens tube 6 via the analog section 13 based on the drawing data corrected by the third arithmetic unit 21, and deflects the electron beam 22 to draw a desired pattern on a sample 10 on the stage 11.

According to the second embodiment, the temperature of the main deflection amplifier 5 is measured, and an output of the main deflection amplifier 5 is corrected based on a temperature change on the side of the main deflection amplifier 5. As a result, even in a state in which the temperature of the main deflection amplifier fluctuates depending on a density of the pattern of the sample 10 during the drawing, and desired output voltage is not obtained depending on a temperature characteristic of an element in the main deflection amplifier, the output can be corrected to perform high-precision drawing on the main deflection amplifier 5 side without imparting a function for temperature correction on the deflection control circuit 3 side.

Figure 3:
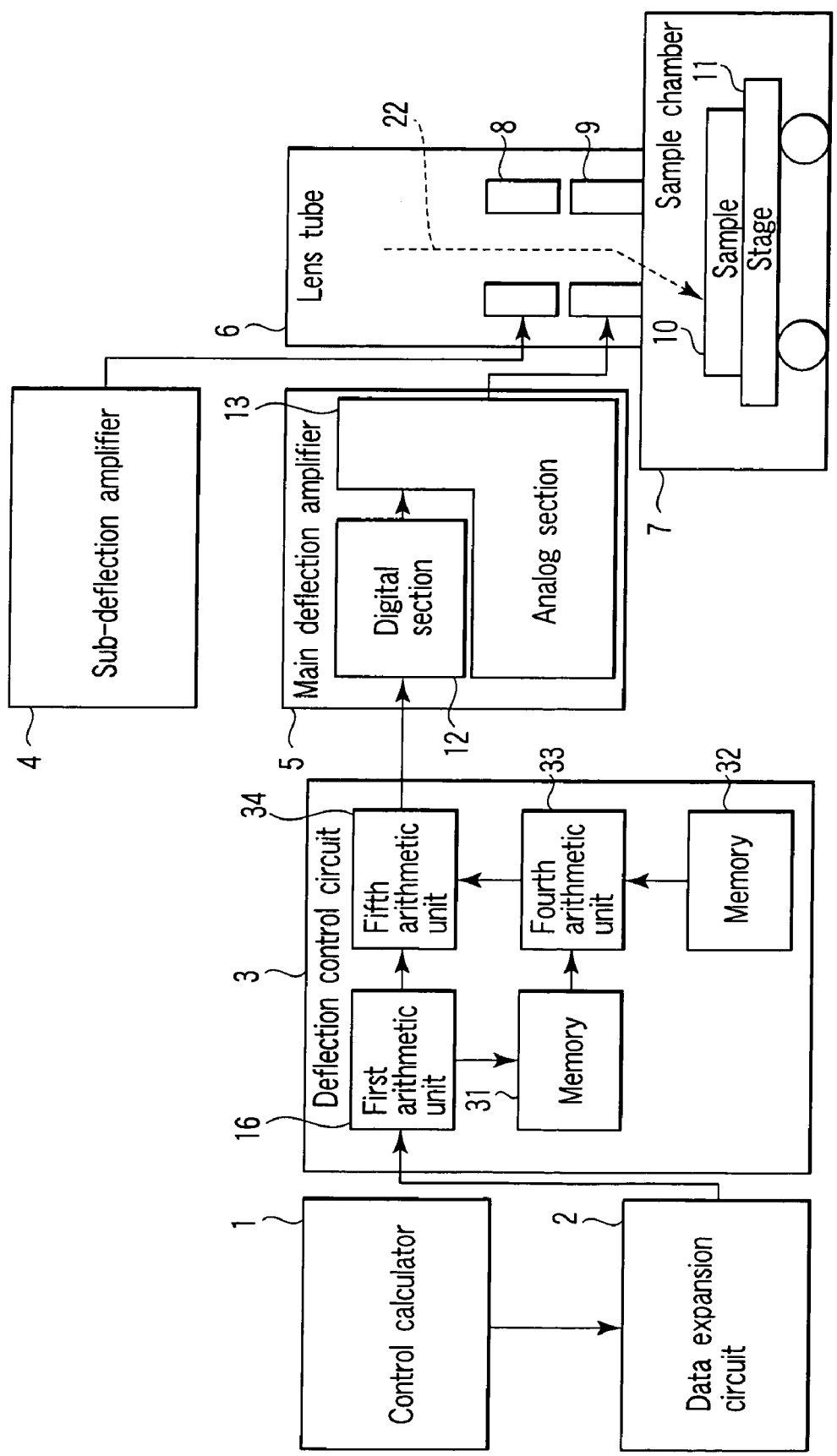
FIG. 3 is a diagram showing a configuration of an electron beam drawing apparatus according to a third embodiment.

FIG. 3 is a diagram showing a configuration of an electron beam drawing apparatus according to a third embodiment of the present invention. In FIG. 3, the same part as that of FIG. 1 or 2 is denoted with the same reference numerals. A basic configuration of the apparatus shown in FIG. 3 is similar to that of FIG. 1 or 2, but the third embodiment is different in that the temperature sensor 14 mounted in the main deflection amplifier 5 in FIGS. 1 and 2 is not disposed. The deflection control circuit 3 comprises: a memory (storage section) 31 for storing a sum of main deflection distances during drawing; a memory (storage section) 32 to store a correction table in which there is described a relation between the sum of the main deflection distances and an output voltage of the main deflection amplifier 5 at a drawing time; and a fourth arithmetic unit 33 and a fifth arithmetic unit 34 which correct the output of the main deflection amplifier 5 in accordance with the sum of the main deflection distances. Here, the sum of the main deflection distances refers to a sum of deflection distances from a main deflection center in a main deflection area.

Figure 4:
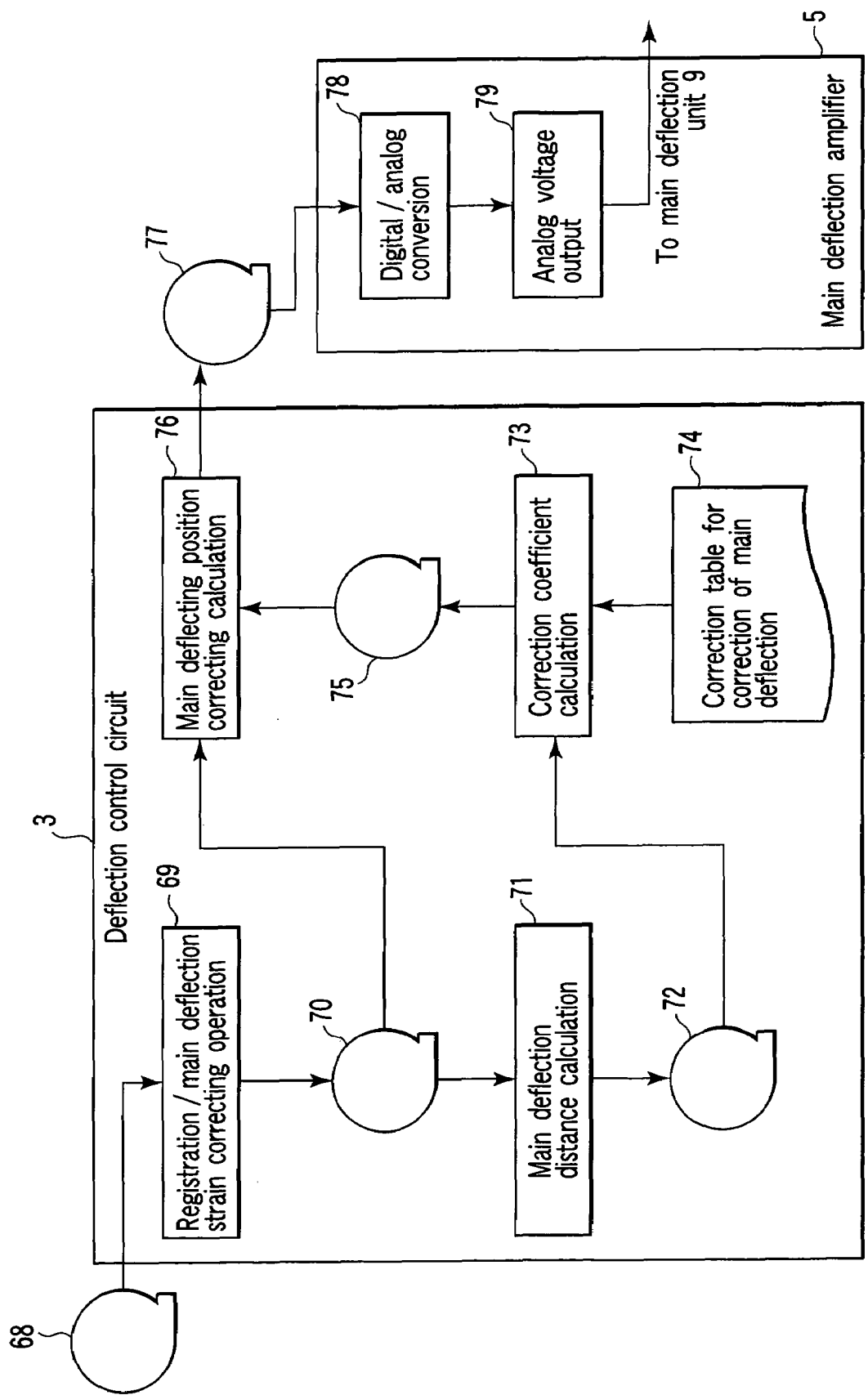
FIG. 4 is a diagram showing a correction process of drawing data and a flow of the data according to the third embodiment.

A function of the above-described electron beam drawing apparatus will be described hereinafter. A correction process of drawing data and a flow of the data are shown in FIG. 4.

To the deflection control circuit 3, a data expansion circuit 2 sends drawing data 68 in which there is described a deflecting (SF) position in the main deflection area and shot information in the deflection area. The first arithmetic unit 16 disposed in the deflection control circuit 3 calculates (registration/main deflection strain correcting calculation 69) a main deflecting position in consideration of a strain of a beam deflecting position by a lens (not shown) disposed in the lens tube 6, and a deviation of a position of the sample 10 from a substrate pattern based on a main deflection distance determined based on stage position information from a stage control section (not shown). The first arithmetic unit sends first correction data 70 to the fifth arithmetic unit 34. The first arithmetic unit 16 calculates (main deflection distance calculation 71) a sum of main deflection distances in the main deflection area, and stores main deflection distance data 72 in the memory 31.

The fourth arithmetic unit 33 calculates (correction coefficient calculation) a main deflecting position correction coefficient 75 from a correction table 74 stored in the memory 32 and the main deflection distance data 72 stored in the memory 31, and sends this correction coefficient 75 to the fifth arithmetic unit 34. Here, the correction table 74 stored in the memory 32 is required for selecting the correction coefficient to correct a deflecting position deviation by heat generation of the deflection amplifier. The table is constituted of a correction table for correcting a long period component depending on a chip layout, and a correction table for correcting a short period component depending on an only deflection distance in the main deflection area.

FIG. 5C is a graph showing the sum of the deflection distances of a main deflection unit along a drawing order in time series in a case where an Si wafer 100 is drawn as shown in FIGS. 5A and 5B. A correction amount 105 is shown in a line graph.

As shown in FIG. 5A, a large number of chips 101 are disposed in the Si wafer 100, and they constitute chip lines 102A, 102B, and 102C. Each chip line is constituted of a plurality of stripes 103A, 103B, etc. In FIGS. 5B and 5C, reference numerals 104A and 104B denote main deflection areas. The correction amount 105 comprises a long period component 106 and a short period component. The fourth arithmetic unit 33 obtains the correction coefficient with reference to the graph and a long and short period correction table prepared beforehand by experiments or the like, and the fifth arithmetic unit 34 corrects the main deflecting position sent from the first arithmetic unit 16. In this case, the correction coefficient 75 sent from the fourth arithmetic unit 33 is calculated based on the deflection distance data 72 of the main deflection area processed (drawn) before a main deflection area regarded as a correction object. Furthermore, the fifth arithmetic unit 34 performs main deflecting position correcting calculation 76 by use of the correction coefficient 75, and sends corrected main deflecting position data 77 to the digital section 12 of the main deflection amplifier 5.

The digital section 12 of the main deflection amplifier 5 performs digital/analog conversion 78 of the second correction data 77 sent from the deflection control circuit 3, controls the main deflection unit 9 of the lens tube 6 via the analog section 13, and deflects the electron beam 22 to draw a desired pattern on the sample 10 on the stage 11.

Moreover, functions of the memory 31, the memory 32, the fourth arithmetic unit 33, and the fifth arithmetic unit 34 can be disposed in the digital section 12 of the main deflection amplifier 5.

Furthermore, in the present embodiment, the main deflecting position is corrected based on the sum of the deflection distances, but the correction tables are prepared as many as sub-deflection areas to be drawn in the main deflection area, and the correcting calculation may be performed.

It is to be noted that in the present embodiment, the correction table which is stored in the memory 32 and in which there is described a relation between the sum of the main deflection distances and the output voltage of the main deflection amplifier 5 is prepared beforehand by an experiment or simulation. A method of preparing the correction table will be described later.

According to the third embodiment, the main deflecting position to be drawn is corrected based on the sum of the deflection distances in the deflection area processed (drawn) before. Accordingly, even in a state in which the temperature of the main deflection amplifier fluctuates during the drawing, and desired output voltage is not obtained depending on a temperature characteristic of an element in the main deflection amplifier, the position can be corrected to perform high-precision drawing.

Figure 6A:
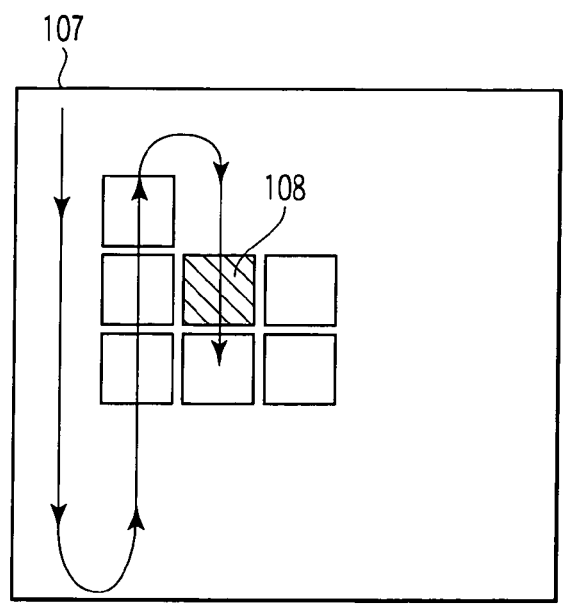
FIGS. 6A and 6B are diagrams showing a position deviation of a drawing pattern depending on a density difference according to a fourth embodiment.
Figure 6B:
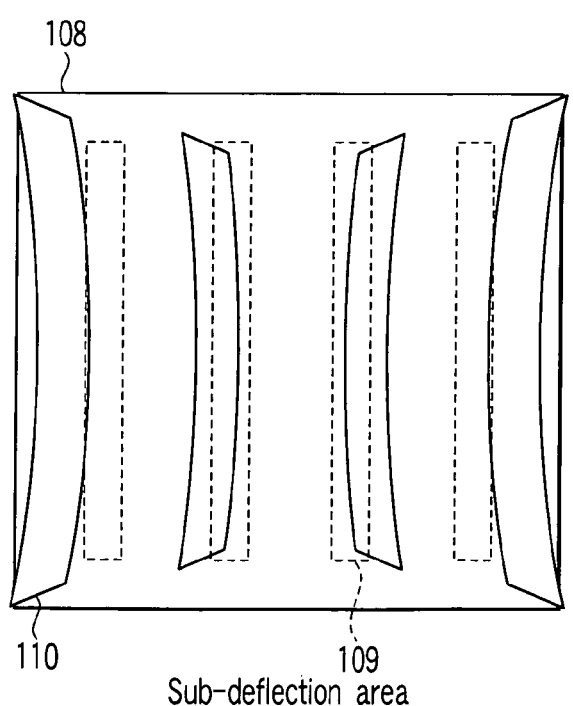

In a fourth embodiment of the present invention, an output correcting function of a sub-deflection amplifier is added to the third embodiment. In the same manner as in the main deflection amplifier, a change is generated in an output voltage of an analog amplifier of a sub-deflection unit, when a reference resistance changes with temperature. FIG. 6B shows an example of a shot position deviation by a temperature rise of the sub-deflection amplifier. When a main deflection area 107 is drawn as shown in FIG. 6A, a shot position in a sub-deflection area 108 is influenced by a change of an amplifier temperature attributable to a sub-deflection area drawn before the sub-deflection area 108. Therefore, as shown in FIG. 6B, a position of a designed pattern 109 causes a position deviation, and is drawn as in, for example, a drawing pattern 110.

Figure 7:
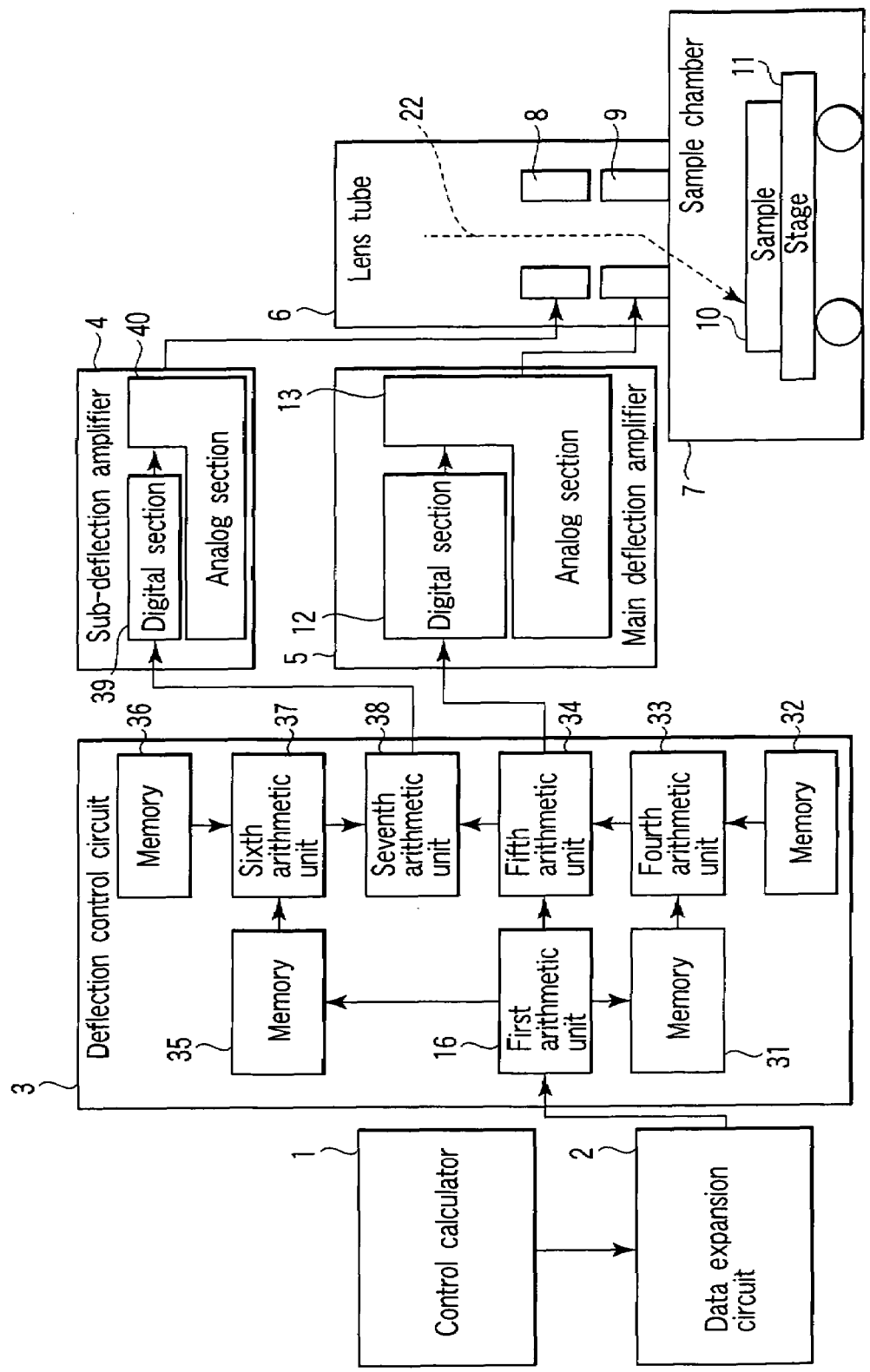
FIG. 7 is a diagram showing a configuration of an electron beam drawing apparatus according to the fourth embodiment.

FIG. 7 is a diagram showing a configuration of an electron beam drawing apparatus according to the fourth embodiment of the present invention. In FIG. 7, the same part as that of FIG. 3 is denoted with the same reference numerals. A basic configuration of the apparatus shown in FIG. 7 is similar to that shown in FIG. 3, but the present embodiment is different in that the deflection control circuit 3 is provided with: a memory (storage section) 35 for storing a sum of sub-deflection distances at a drawing time; a memory (storage section) 36 to store a correction table in which there is described a relation between the sum of the sub-deflection distances at the drawing time and the output voltage of the sub-deflection amplifier 4; and a sixth arithmetic unit 37 and a seventh arithmetic unit 38 which correct an output of the sub-deflection amplifier 4 in accordance with the sum of the sub-deflection distances. Here, the sum of the sub-deflection distances refers to a sum of deflection distances from a sub-deflection center in a sub-deflection area.

Figure 8:
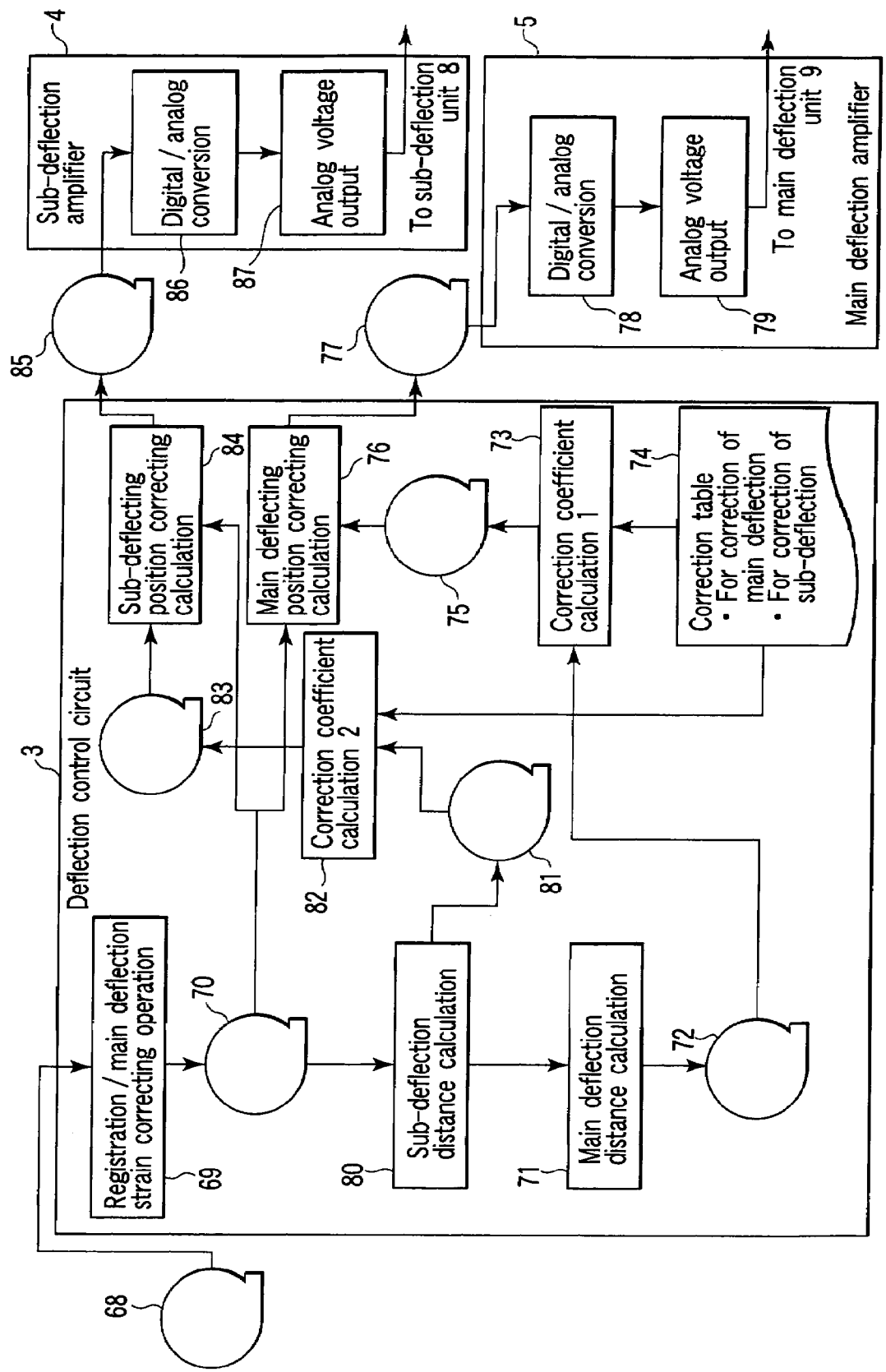
FIG. 8 is a diagram showing a correction process of drawing data and a flow of the data according to the fourth embodiment.

A function of the above-described electron beam drawing apparatus will be described hereinafter. A correction process of drawing data and a flow of the data are shown in FIG. 8.

To the deflection control circuit 3, the data expansion circuit 2 sends drawing data 68 in which there is described a deflecting (SF) position in the main deflection area and shot information in the deflection area. The first arithmetic unit 16 disposed in the deflection control circuit 3 calculates (registration/main deflection strain correcting calculation 69) a main deflecting position in consideration of a strain of a beam deflecting position by a lens (not shown) disposed in the lens tube 6, and a deviation of a position of the sample 10 from a substrate pattern based on a main deflection distance determined based on stage position information from a stage control section (not shown). The first arithmetic unit sends first correction data 70 to the fifth arithmetic unit 34. The first arithmetic unit 16 calculates (sub-deflection distance calculation 80) the sum of the sub-deflection distances in the sub-deflection area, stores sub-deflection distance data 81 in the memory 35, calculates (main deflection distance calculation 71) a sum of main deflection distances in the main deflection area, and stores main deflection distance data 72 in the memory 31.

The fourth arithmetic unit 33 calculates (first correction coefficient calculation 73) a main deflecting position correction coefficient 75 from a correction table 74 stored in the memory 32 and main deflection distance data 72 stored in the memory 31, and sends this correction coefficient 75 to the fifth arithmetic unit 34. Here, the correction table stored in the memory 32 is required for selecting the correction coefficient to correct a deflecting position deviation by heat generation of the deflection amplifier. The table is constituted of a correction table for correcting a long period component, and a correction table for correcting a short period component.

Similarly, the sixth arithmetic unit 37 calculates (second correction coefficient calculation 82) a sub-deflecting position correction coefficient 83 from the sub-deflection correction table 74 stored in the memory 36 and the sub-deflection distance data 81 stored in the memory 35, and sends the correction coefficient 83 to the seventh arithmetic unit 38. Here, the correction table stored in the memory 36 is a correction table for selecting the correction coefficient to correct a deflecting position deviation by heat generation of a sub-deflection amplifier, and for correcting the short period component which depends on the sum of the deflection distances in the sub-deflection area.

Furthermore, the fifth arithmetic unit 34 performs main deflecting position correcting calculation 76 by use of the correction coefficient 75, and sends corrected main deflecting position data 77 to the digital section 12 of the main deflection amplifier 5. Similarly, the seventh arithmetic unit 38 performs sub-deflecting position correcting calculation 84 by the sub-deflection coefficient 83 calculated by the sixth arithmetic unit 37, and the first correction data 70, and sends corrected sub-deflecting position data 85 to a digital section 39 of the sub-deflection amplifier 4. In this case, the correction coefficient 83 sent from the sixth arithmetic unit 37 is calculated based on the sub-deflection distance data 81 processed (drawn) before the sub-deflection area regarded as the calculation object.

The digital section 12 of the main deflection amplifier 5 performs digital/analog conversion 78 of the second correction data 77 sent from the deflection control circuit 3, controls the main deflection unit 9 of the lens tube 6 via the analog section 13, simultaneously controls the sub-deflection unit 8 via the sub-deflection amplifier 4 to thereby deflect the electron beam 22 and draws a desired pattern on the sample 10 on the stage 11.

Moreover, functions of the memory 31, the memory 32, the fourth arithmetic unit 33, and the fifth arithmetic unit 34 can be disposed in the digital section 12 of the main deflection amplifier 5.

Furthermore, in the present embodiment, the main deflecting position is corrected based on the sum of the main deflection distances, but the correction tables are prepared as many as sub-deflection areas (SF) to be drawn in the main deflection area, and the correcting calculation may be performed in the fifth arithmetic unit 34. Similarly, in the present embodiment, the sub-deflecting position (shot position) is corrected based on the sum of the sub-deflection distances, but the correction tables are prepared as many as shots in the sub-deflection area, and the correcting calculation may be performed in the seventh arithmetic unit 38.

It is to be noted that in the present embodiment, by an experiment or simulation, there are prepared beforehand the correction table which is stored in the memory 32 and in which there is described a relation between the sum of the main deflection distances and the output voltage of the main deflection amplifier 5, and the correction table which is stored in the memory 36 in which there is described a relation between the sum of the sub-deflection distances and the output voltage of the sub-deflection amplifier 4. A method of preparing the correction tables will be described later.

According to the fourth embodiment, the main deflecting position to be drawn and the shot position are corrected based on the sum of the deflection distances in the deflection area processed (drawn) before. As a result, even in a state in which the temperature of the deflection amplifier fluctuates during the drawing, and desired output voltage is not obtained depending on a temperature characteristic of an element in the deflection amplifier, the positions can be corrected to perform high-precision drawing.

FIG. 9 is a diagram showing a configuration of an electron beam drawing apparatus according to a fifth embodiment of the present invention. In FIG. 9, the same part as that of FIG. 1 is denoted with the same reference numerals. A basic configuration of the apparatus shown in FIG. 9 is similar to that of FIG. 1, but the present embodiment is different in that the temperature sensor 14 disposed in the main deflection amplifier 5 in FIG. 1 is disposed on the stage 11.

A function of the above-described electron beam drawing apparatus will be described hereinafter. On the stage 11 in the sample chamber 7, there is disposed the temperature sensor 14 for measuring a temperature of a stage chuck. When the temperature sensor 14 is disposed in the vicinity of a wafer as the sample 10, the temperature of the wafer can be exactly measured. In a case where thermal expansion by running of a stage main body is measured, the temperature sensor 14 is preferably disposed in the vicinity of a frictional driving portion in which the influence is remarkable.

The first arithmetic unit 16 of the deflection control circuit 3 processes drawing data from the data expansion circuit 2. This first arithmetic unit 16 performs arithmetic processing to correct a strain of a beam deflecting position by a lens (not shown) which is disposed in the lens tube 6 and which is to be used in focusing the beam, processing to calculate an output of the main deflection amplifier 5 based on stage position information from a stage control section (not shown) and the like.

Moreover, the receiving section 17 of the deflection control circuit 3 receives temperature data of the temperature sensor 14 disposed on the stage 11 from the temperature sensor 14. The temperature data transmitted from the temperature sensor 14 is received by the receiving section 17, A/D converted, and thereafter stored in the first memory 18 in the deflection control circuit 3. In the second memory 19 in the deflection control circuit 3, a temperature correction table is stored in which there is described a relation between the temperature of the stage and the output voltage (or a position of the stage) of the main deflection amplifier.

The second arithmetic unit 20 calculates a temperature adjusting coefficient for adjusting the output voltage (or the stage position) of the main deflection amplifier 5 based on the temperature data of the stage stored in the first memory 18 and the temperature correction table stored in the second memory 19. The third arithmetic unit 21 adds the temperature adjusting coefficient sent from the second arithmetic unit 20 to the drawing data sent from the first arithmetic unit 16 or multiplies the drawing data by the coefficient to correct the drawing data. The third arithmetic unit 21 sends the corrected drawing data to the digital section 12 of the main deflection amplifier 5.

The digital section 12 of the main deflection amplifier 5 controls the main deflection unit 9 of the lens tube 6 via the analog section 13 based on the drawing data sent from the deflection control circuit 3, and deflects the electron beam 22 to draw a desired pattern on the sample 10 on the stage 11.

It is to be noted that according to the fifth embodiment, an output of the main deflection amplifier 5 is corrected based on a temperature change of the stage 11. Instead of correcting the output of the main deflection amplifier 5, the third arithmetic unit 21 may send to the stage control section the drawing data corrected based on the temperature correction table in which there is described a relation between the temperature of the stage and the position of the stage, and the stage control section may change the position of the stage 11.

According to the fifth embodiment, the temperature of the stage 11 is measured, and the output of the main deflection amplifier 5 or the stage position is corrected based on the temperature change. As a result, even in a case where the temperature of the stage 11 or the sample 10 fluctuates, and the stage or the sample thermally expands in accordance with a running history of the stage 11, high-precision drawing can be performed due to the above correction.

Figure 10:
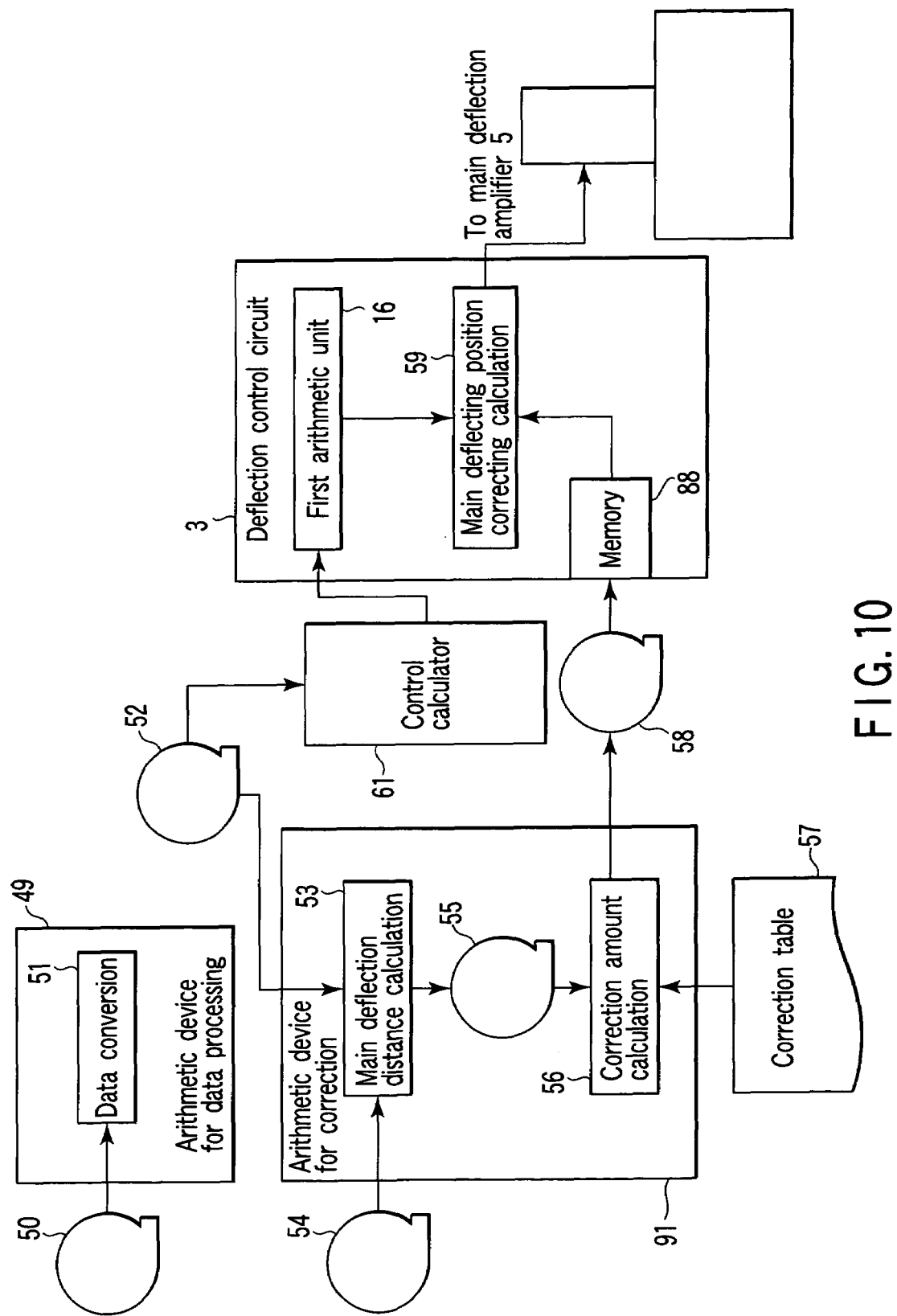
FIG. 10 is a diagram schematically showing a flow of drawing data according to a sixth embodiment.

FIG. 10 is a diagram schematically showing a flow of drawing data according to a sixth embodiment of the present invention. In the third embodiment, the deflection control circuit 3 performs a correction coefficient calculating operation for correcting a main deflecting (SF) position, but in the sixth embodiment, a correction amount map 58 is prepared beforehand off-line, and the deflecting position is corrected with reference to the correction amount map 58 at a drawing time.

In an arithmetic device 49 for data processing, first by preprocessing, stream data is converted into intermediate data in such a manner that a program is easily processed in order to convert design data 50 into data for an electron beam drawing apparatus. Moreover, the intermediate data is subjected to a logical operation to remove figure overlapping or the like, or pattern correction processing for proximity effect correction, and the data is converted to output drawing data 52 (data conversion 51).

Next, in an arithmetic device 91 for correction, an operation 53 of calculating a sum of deflection distances is performed for each main deflection area by use of the input drawing data 52 and chip layout data 54 on a wafer designed beforehand, and a main deflection distance map 55 is prepared.

Figure 11B:
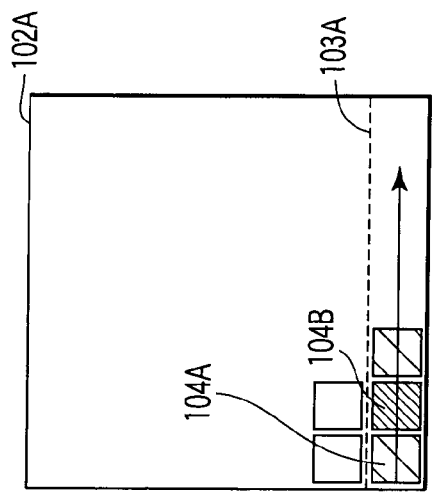
FIGS. 11A, 11B, 11C, and 11D are diagrams showing a main deflection distance map according to the sixth embodiment.
Figure 11D:
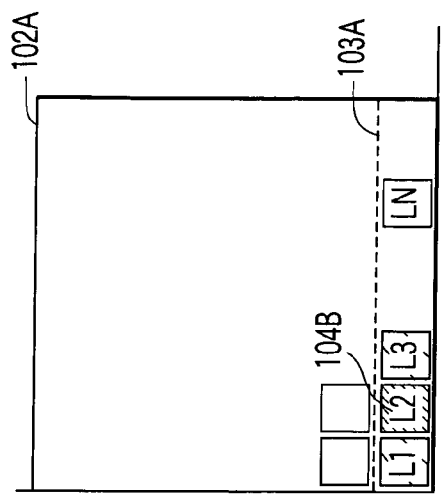
Figure 11A:
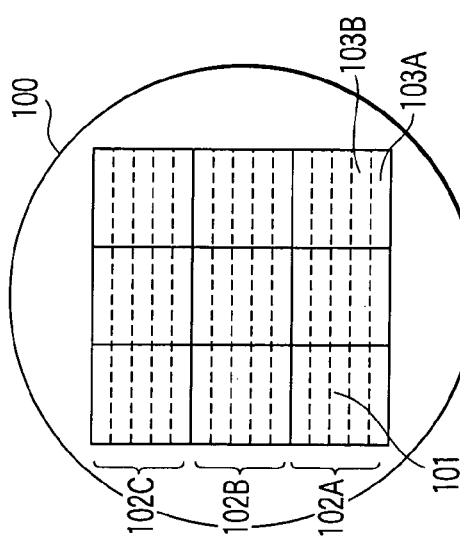
Figure 11C:
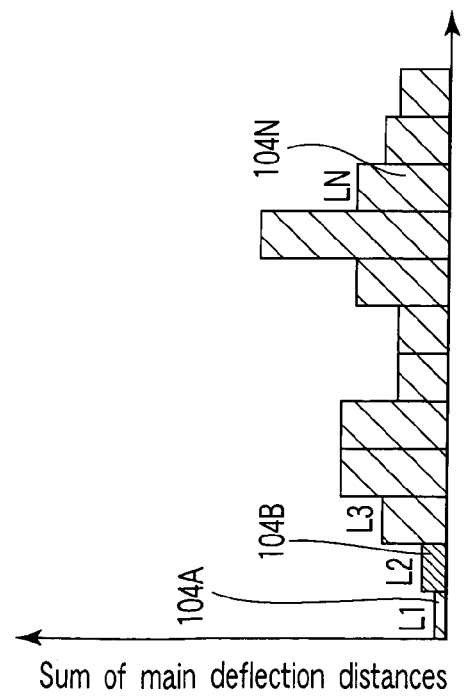

The main deflection distance map will be described with reference to FIGS. 11A to 11D. In a case where chips 101 are disposed in an Si wafer 100 as shown in FIG. 11A in accordance with the layout data 54, a sum of main deflection distances by drawing of the Si wafer 100 shown in FIG. 11B has a determined value with respect to a main deflecting position as shown in FIG. 11C. For example, the sum of the deflection distances is L2 with respect to a second main deflection area 104B. A file in which this value is described for each main deflection area is the main deflection distance map, and the map can be schematically shown as in FIG. 11D.

Next, correction amount calculation 56 is performed to calculate a main deflecting (SF) position correction coefficient of the drawing data 52 by use of the prepared deflection distance map 55 and a correction table 57, and the correction amount map 58 is prepared in which the correction coefficient is described for all of the main deflection areas in the same manner as in the main deflection distance map.

Figure 12A:
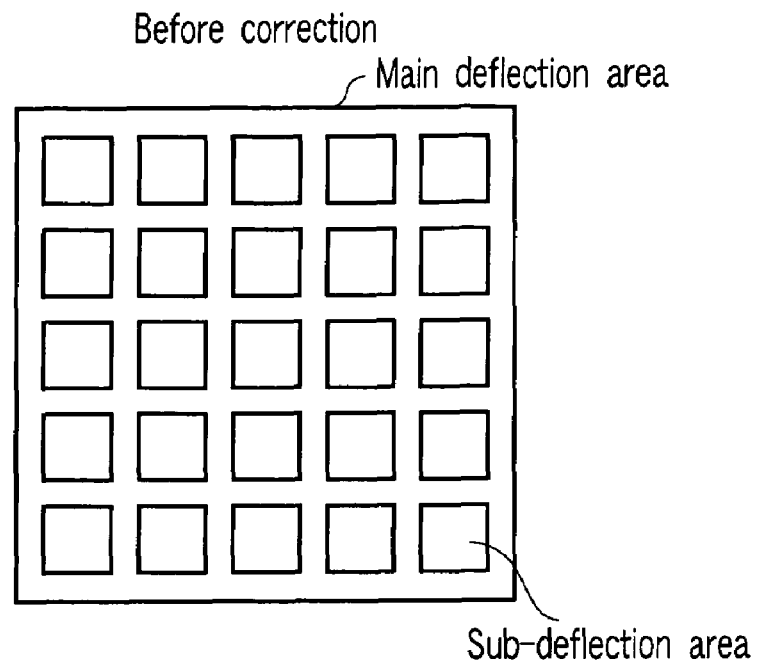
FIGS. 12A and 12B are diagrams showing main deflecting position correction according to the sixth embodiment.
Figure 12B:
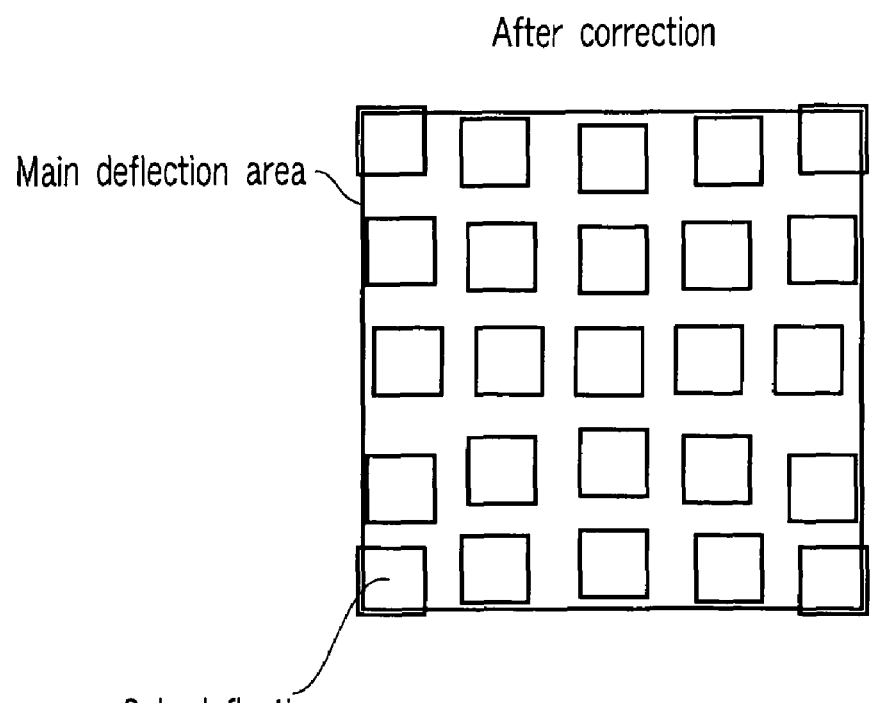

At the drawing time, the first arithmetic unit 16 in the deflection control circuit 3 performs main deflecting position correcting calculation 59 by use of the drawing data 52 input via a control calculator 61, and the correction amount map 58 prepared off-line and stored in a memory (storage section) 88. A deflection unit is controlled via the main deflection amplifier 5 of an electron beam drawing apparatus, and a pattern is drawn on the sample 10. For example, main deflecting position data before correction shown in FIG. 12A is corrected into data in consideration of a deflecting position deviation, and drawn as shown in FIG. 12B.

FIG. 13 is a diagram showing a configuration of an electron beam drawing apparatus according to the sixth embodiment. A basic configuration of the apparatus shown in FIG. 13 is similar to that of FIG. 2. However, the apparatus of the present embodiment does not have a temperature adjustment coefficient calculating function using a temperature sensor in an amplifier by the temperature sensor 14, the first memory 18, the second memory 19, the second arithmetic unit 20, and the third arithmetic unit 21 mounted in the main deflection amplifier 5 in FIG. 2. The apparatus has a configuration in which a deflection control circuit 3 is provided with an eighth arithmetic unit 41 for calculating a main deflecting position.

Moreover, in the sixth embodiment, the main deflecting position is corrected based on a sum of main deflection distances, but correction tables may be prepared as many as sub-deflection areas (SF) to be drawn in a main deflection area to perform correcting calculation. As a result, even in a state in which a temperature of a deflection amplifier fluctuates depending on a density of a pattern in a deflection area during the drawing, and desired output voltage is not obtained depending on a temperature characteristic of an element in the deflection amplifier, drawing is performed using correction data in consideration of a temperature change of the amplifier beforehand, and accordingly high-precision drawing can be performed.

In a seventh embodiment of the present invention, a correction amount map 66 for correction of a sub-deflecting position (shot position) is prepared in addition to off-line preparation of a correction amount map 58 for correction of a main deflecting position as in the sixth embodiment.

Figure 14:
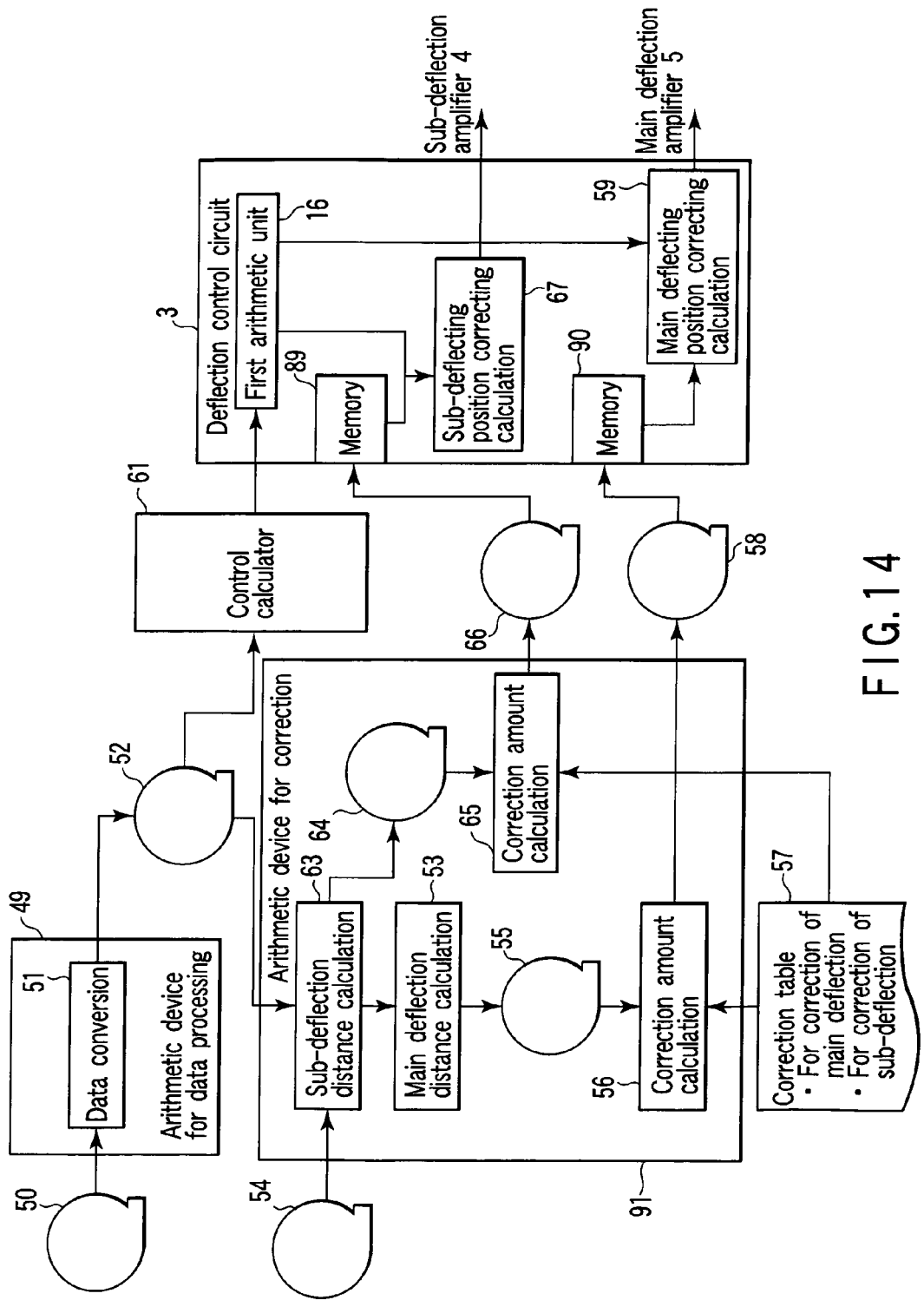
FIG. 14 is a diagram schematically showing a flow of drawing data according to a seventh embodiment.

FIG. 14 is a diagram schematically showing a flow of drawing data according to the seventh embodiment.

In an arithmetic device 49 for data processing, first by preprocessing, stream data is converted into intermediate data in such a manner that a program is easily processed in order to convert design data 50 into data for an electron beam drawing apparatus. Moreover, the intermediate data is subjected to a logical operation to remove figure overlapping or the like, or pattern correction processing for proximity effect correction, and the data is converted to output drawing data 52 (data conversion 51).

Next, in an arithmetic device 91 for correction, an operation 63 of calculating a sum of sub-deflection distances is performed for each sub-deflection area by use of the input drawing data 52 and chip layout data 54 on a wafer designed beforehand, and a sub-deflection distance map 64 is prepared. Similarly, a main deflection distance is also calculated (main deflection distance calculation 53), and a main deflection distance map 55 is prepared.

Concerning correction of the shot position in the sub-deflection area, correction amount calculation 65 is performed to calculate a shot position correction coefficient in a sub-deflection area of pattern data by use of the prepared sub-deflection distance map 64 and a correction table 57 for correcting a sub-deflecting position, and the sub-deflection correction amount map 66 is prepared in which shot position correction coefficients are described with respect to all of the sub-deflection areas. Concerning the position correction in the main deflection area, the main deflection correction amount map 58 is prepared using the method described in the sixth embodiment.

At the drawing time, the eighth arithmetic unit 41 in the deflection control circuit 3 performs main deflecting position correcting calculation 59 by use of the drawing data 52 input via the control calculator 61, and the correction amount map 58 prepared off-line and stored in a memory (storage section) 90. Simultaneously with the main deflecting position correcting calculation 59, a ninth arithmetic unit 42 performs sub-deflecting position correcting calculation 67 by use of the correction amount map 66 prepared off-line and stored in a memory (storage section) 89. Each calculated deflecting position data is transferred to the main deflection amplifier 5 and the sub-deflection amplifier 4 as desired to control each deflection unit, and a pattern is drawn on the sample 10.

Figure 15:
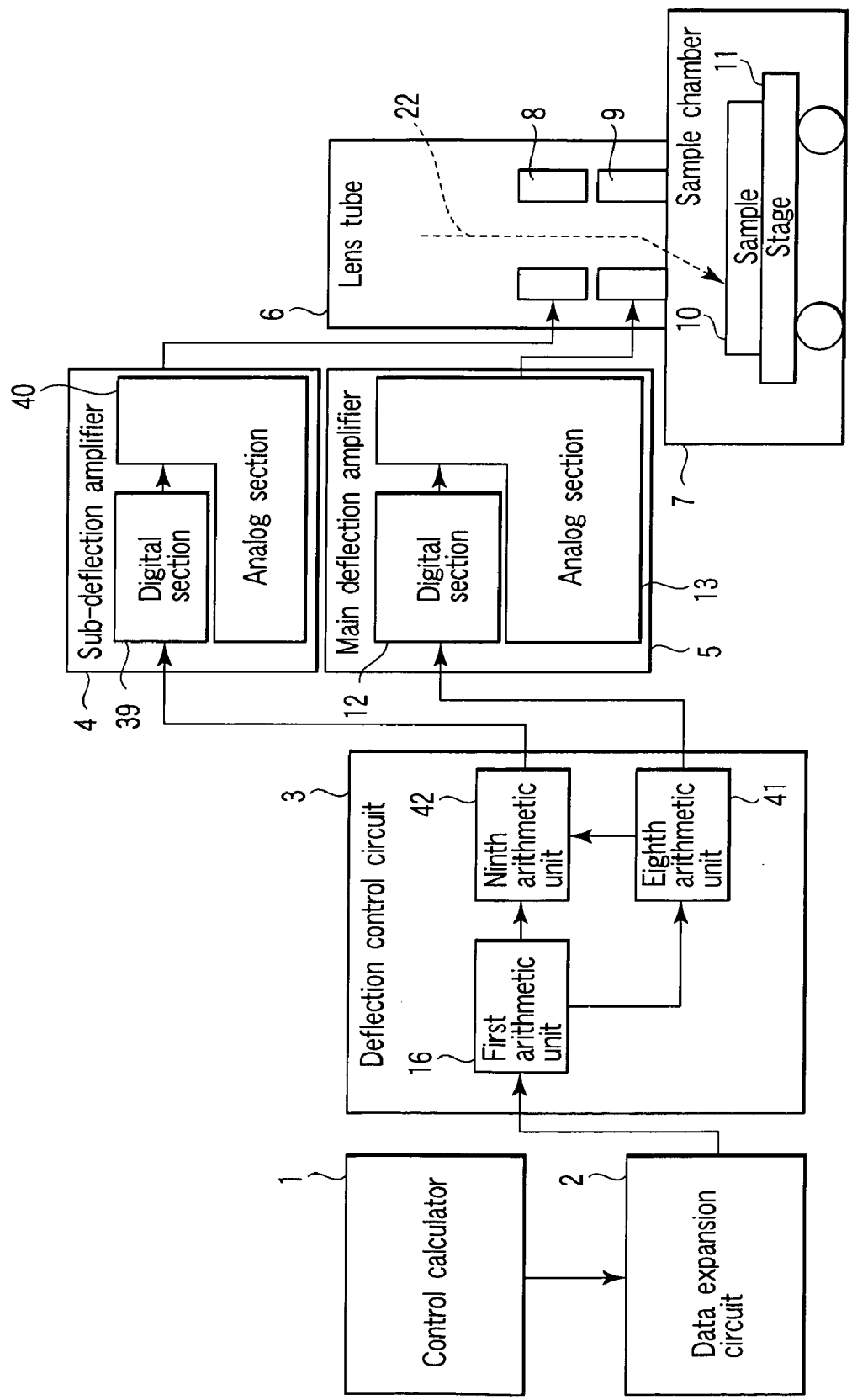
FIG. 15 is a diagram showing a configuration of an electron beam drawing apparatus according to the seventh embodiment.

FIG. 15 is a diagram showing a configuration of an electron beam drawing apparatus according to the seventh embodiment. A basic configuration of the apparatus shown in FIG. 15 is similar to that of FIG. 13, but the apparatus has a configuration in which the ninth arithmetic unit 42 for sub-deflecting position correcting calculation is added to the deflection control circuit 3 in addition to the eighth arithmetic unit 41 for main deflecting position correcting calculation.

Moreover, in the seventh embodiment, the main deflecting position is corrected based on the sum of the main deflection distances, but correction tables may be prepared as many as sub-deflecting areas (SF) to be drawn in the main deflection area to perform the correcting calculation. As a result, even in a state in which the temperature of the deflection amplifier fluctuates depending on a density of the pattern in the deflection area during the drawing, and desired output voltage is not obtained depending on a temperature characteristic of an element in the deflection amplifier, the drawing is performed using the correction data in consideration of the temperature change of the amplifier beforehand, and accordingly high-precision drawing can be performed.

There will be described hereinafter a method of preparing the correction table for use in the seventh embodiment. Here, there will be described an example of the correction table for use in deriving a main deflection distance correction coefficient for main deflecting (SF) position correction.

A main deflecting position deviation by a temperature change of the main deflection amplifier is constituted of a long period component which depends on a chip layout and a short period component which depends on an only deflection distance in the main deflection area. Therefore, a correction table for correcting these two components is prepared by an experiment.

Figure 16:
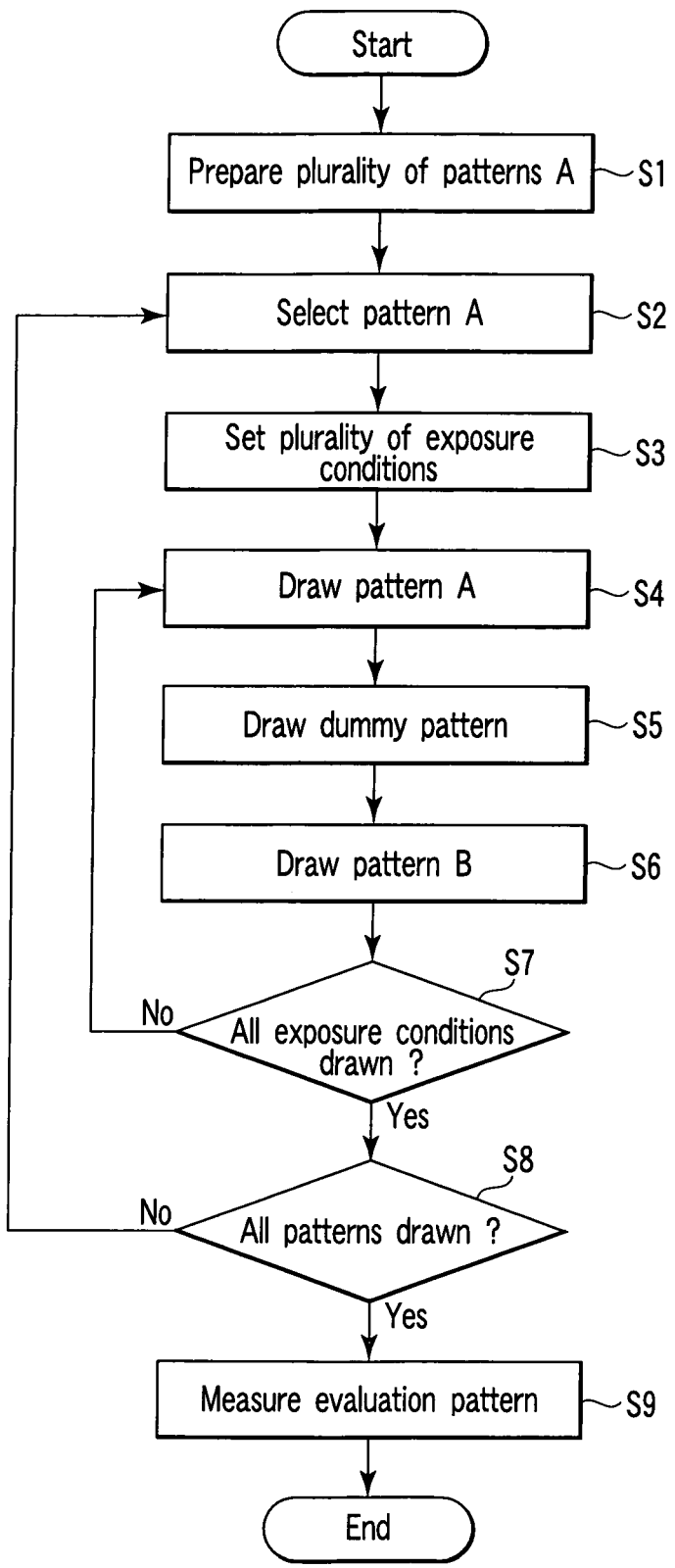
FIG. 16 is a flowchart showing the preparation of a correction table according to the seventh embodiment.

The preparation of the correction table of the short period component will be described hereinafter with reference to a flowchart of FIG. 16. First in step S1, there are prepared a dummy pattern 202 and an evaluation pattern 201 shown in FIGS. 17A, 17B. Specifically, there are prepared a dummy pattern shown in FIG. 17C and an evaluation pattern shown in FIG. 17D. As a pattern drawn on the Si wafer 100, a pattern is disposed in which a sum of deflection distances in a main deflection area of the dummy pattern is changed.

In step S2, a pattern A is selected, and in step S3, a plurality of exposure conditions are set, and the prepared pattern is drawn on the Si wafer 100. In this case, in the drawing method, first in step S4, an evaluation pattern A205 is drawn in a plurality of deflecting positions in the main deflection area, and thereafter in step 5, the dummy pattern whose total deflection distance is known is drawn for the main deflection area. After end of the drawing of the dummy pattern, in step S6, an evaluation pattern B206 is drawn in a position of the evaluation pattern A205 drawn first as shown in FIG. 17D. The above-described steps S4 to S6 are regarded as a cycle of evaluation pattern drawing with respect to one main deflection distance condition (exposure condition). In step S7, the drawing is performed with respect to the total main deflection distance. The evaluation pattern A is drawn in another main deflection area, and a dummy pattern set to main deflection distance conditions different from the previous conditions is drawn until all patterns are drawn in step S8. After drawing the dummy patterns, an evaluation pattern B is drawn. After all of the patterns are drawn in the step S8, an evaluation pattern is measured in step S9.

Figure 18A:
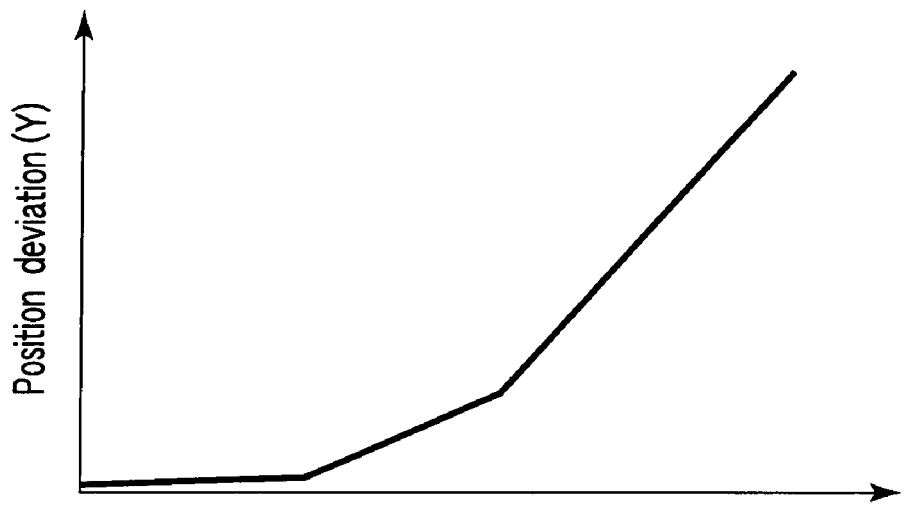
FIGS. 18A and 18B are drawings showing the preparation of the correction table according to the seventh embodiment.

FIG. 18A is a graph in which the position deviation amount between the drawn evaluation patterns A205 and B206 in one main deflecting position is plotted with respect to the main deflection distance of the dummy pattern. Since the graph of the position deviation amounts with respect to the sum of the main deflection distances can be obtained with respect to a plurality of deflecting positions in the main deflection area, it is possible to prepare a correction table for correcting the short period component of the deflecting position deviation in the main deflection area. It is to be noted that the correction amount in which the deviation amount of a measurement point is interpolated is used in a deflecting position which is not measured.

On the other hand, it is also possible to prepare a correction table for correcting a long period component which depends on the chip layout by use of a similar evaluation pattern. A basic evaluation method is similar to a method at a time of the preparing of the correction table of the short period component, but the evaluation pattern is drawn while changing a drawing time or the number of drawing areas of the dummy pattern.

Figure 18B:
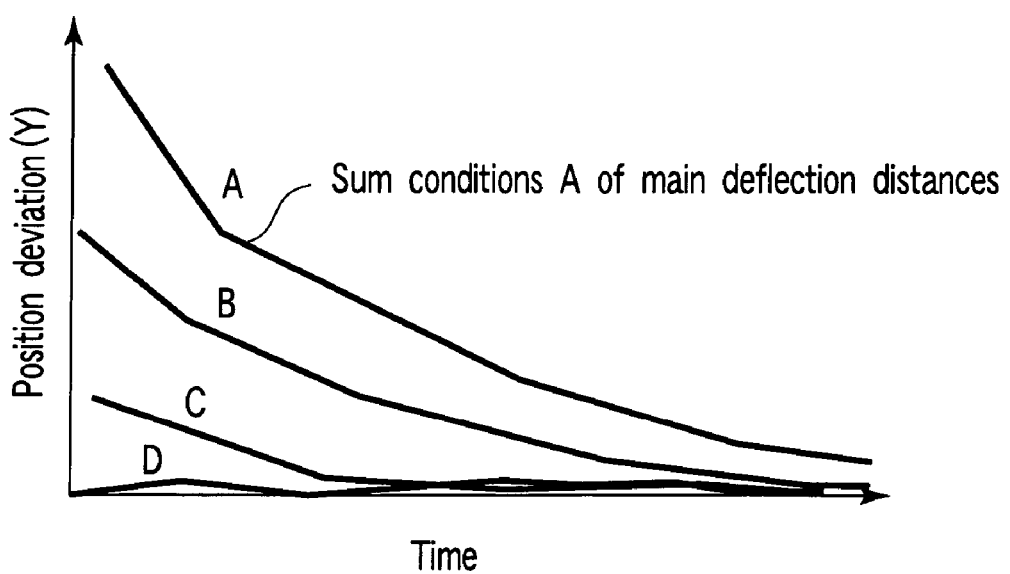

The position deviation amount which can be measured from the evaluation pattern drawn in this method is a position deviation amount with respect to a product of the main deflection distance and the drawing time, and a graph can be prepared as shown in FIG. 18B. In FIG. 18B, A to D indicate that the total deflection distance is changed to four conditions. The correction amount can be obtained with respect to accumulated deflection distance and drawing time by use of this graph, and it is possible to prepare the correction table of the long-period component of the deflecting position deviation in the main deflection area. It is to be noted that the correction amount in which the deviation amount of the measurement point is interpolated is used in the deflecting position which is not measured.

It is to be noted that the processing in the electron beam drawing apparatus of the present embodiment is executed by the execution of an electron beam drawing program built in a computer.

According to the present embodiments, there can be provided an electron beam drawing apparatus, a deflection amplifier, a deflection control device, an electron beam drawing method, a method of manufacturing a semiconductor device, and an electron beam drawing program which can perform high-precision drawing position correction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam drawing apparatus comprising:
   at least one stage of a deflection amplifier;
   a deflection unit configured to deflect an electron beam for performing electron beam drawing based on a voltage supplied from the deflection amplifier;
   a first storage section which stores shot information at a drawing time;
   a second storage section which stores a correction table indicating a relation between a temperature information of the deflection amplifier and the output voltage of the deflection amplifier; and
   an adjusting section which adjusts the output voltage of the deflection amplifier based on the correction table stored in the second storage section and the shot information stored in the first storage section.

2. The electron beam drawing apparatus according to claim 1, wherein the deflection amplifier and the deflection unit comprise a main deflection amplifier, a main deflection unit, a sub-deflection amplifier, and a sub-deflection unit,
   the first storage section stores the shot information in a sub-deflection area at the drawing time,
   the second storage section stores the correction table indicating a relation between the shot information in the sub-deflection area and the output voltage of the main deflection amplifier; and
   the adjusting section adjusts the output voltage of the main deflection amplifier based on the correction table stored in the second storage section, and the shot information stored in the first storage section.

3. An electron beam drawing apparatus comprising:
   at least one stage of a deflection amplifier;
   a deflection unit configured to deflect an electron beam for performing electron beam drawing based on an output voltage supplied from the deflection amplifier;
   a temperature sensor disposed in the deflection amplifier, wherein the temperature sensor measures a temperature of the deflection amplifier;
   a first storage section which stores temperature information supplied from the temperature sensor;
   a second storage section which stores a correction table indicating a relation between a temperature of the deflection amplifier and the output voltage of the deflection amplifier; and
   an adjusting section which adjusts the output voltage of the deflection amplifier based on a correction table stored in the second storage section and the temperature information stored in the first storage section.

4. The apparatus according to claim 3, wherein the deflection amplifier includes an analog section and a digital section, and wherein the temperature sensor is disposed in the analog section and senses a temperature of the analog section.

5. A deflection amplifier comprising: a temperature sensor disposed in a main internal component; a first storage section which stores temperature information of the temperature sensor; a second storage section which stores a correction table indicating a relation between an internal temperature and an output voltage; and an adjusting section which adjusts an output based on the correction table stored in the second storage section and the temperature information stored in the first storage section.

* * * * *